US012695067B2

(12) United States Patent
Rathnasinghe et al.

(10) Patent No.: US 12,695,067 B2
(45) Date of Patent: Jul. 28, 2026

(54) BOTTOM AND MIDDLE EDGE RINGS

(71) Applicant: Lam Research Corporation, Fremont, CA (US)

(72) Inventors: Hiran Rajitha Rathnasinghe, Fremont, CA (US); Shawn Tokairin, Fremont, CA (US); Jon Mcchesney, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 17/681,633

(22) Filed: Feb. 25, 2022

(65) Prior Publication Data

US 2022/0189745 A1 Jun. 16, 2022

Related U.S. Application Data

(62) Division of application No. 16/487,703, filed as application No. PCT/US2017/062769 on Nov. 21, 2017, now Pat. No. 12,237,154.

(51) Int. Cl.
H01J 37/32 (2006.01)
H01L 21/687 (2006.01)
(Continued)

(52) U.S. Cl.
CPC .... H01J 37/32642 (2013.01); H10P 72/0421 (2026.01); H10P 72/7611 (2026.01); *H01J 2237/049* (2013.01); *H01J 2237/334* (2013.01)

(58) Field of Classification Search
CPC ........... H01J 37/32642; H01J 2237/049; H01J 2237/334; H01L 21/67069; H01L 21/68735
(Continued)

(56) References Cited

U.S. PATENT DOCUMENTS 3,534,753 A 10/1970 Ollivier
4,262,686 A 4/1981 Heim et al.
(Continued)

FOREIGN PATENT DOCUMENTS

CN 1189859 A 8/1998
CN 1682344 A 10/2005
(Continued)

OTHER PUBLICATIONS

International Search Report and Written Opinion issued in PCT/US2017/062769, mailed Aug. 21, 2018; ISA/KR.
(Continued)

*Primary Examiner* — Charlee J. C. Bennett

(57) ABSTRACT
A bottom ring is configured to support a moveable edge ring that is configured to be raised and lowered relative to a substrate support. The bottom ring includes an upper surface that is stepped, an annular inner diameter, an annular outer diameter, a lower surface, a plurality of vertical guide channels provided through the bottom ring from the lower surface to the upper surface of the bottom ring, each of the guide channels including a first region having a smaller diameter than the guide channel and being configured to receive respective lift pins for raising and lowering the edge ring, and a guide feature extending upward from the upper surface of the bottom ring.

18 Claims, 11 Drawing Sheets

(51) Int. Cl.
   *H10P 72/00*          (2026.01)
   *H10P 72/76*          (2026.01)
(58) Field of Classification Search
   USPC ..................................................... 156/345.3
   See application file for complete search history.

(56)                    References Cited

U.S. PATENT DOCUMENTS

| | | | |
|---|---|---|---|
| 4,374,698 A | 2/1983 | Sanders et al. | |
| 4,431,477 A | 2/1984 | Zajac | |
| 4,793,897 A | 12/1988 | Dunfield et al. | |
| 5,220,515 A | 6/1993 | Freerks et al. | |
| 5,304,248 A | 4/1994 | Cheng et al. | |
| 5,329,965 A | 7/1994 | Gordon | |
| 5,346,578 A | 9/1994 | Benzing et al. | |
| 5,376,214 A | 12/1994 | Iwasaki et al. | |
| 5,413,145 A | 5/1995 | Rhyne et al. | |
| 5,520,969 A | 5/1996 | Nishizato et al. | |
| 5,529,657 A | 6/1996 | Ishii | |
| 5,569,350 A | 10/1996 | Osada et al. | |
| 5,605,179 A | 2/1997 | Strong, Jr. et al. | |
| 5,660,673 A | 8/1997 | Miyoshi | |
| 5,662,143 A | 9/1997 | Caughran | |
| 5,683,517 A | 11/1997 | Shan | |
| 5,702,530 A | 12/1997 | Shan et al. | |
| 5,744,695 A | 4/1998 | Forbes | |
| 5,762,714 A | 6/1998 | Mohn et al. | |
| 5,792,272 A | 8/1998 | van Os et al. | |
| 5,837,058 A | 11/1998 | Chen et al. | |
| 5,840,129 A | 11/1998 | Saenz et al. | |
| 5,851,299 A | 12/1998 | Cheng et al. | |
| 5,886,863 A * | 3/1999 | Nagasaki | H01L 21/6831 |
| | | | 279/128 |
| 5,907,221 A | 5/1999 | Sato et al. | |
| 5,942,039 A | 8/1999 | Kholodenko et al. | |
| 6,022,809 A | 2/2000 | Fan | |
| 6,042,687 A | 3/2000 | Singh et al. | |
| 6,044,534 A | 4/2000 | Seo et al. | |
| 6,048,403 A | 4/2000 | Deaton et al. | |
| 6,050,283 A | 4/2000 | Hoffman et al. | |
| 6,060,400 A | 5/2000 | Oehrlein et al. | |
| 6,062,256 A | 5/2000 | Miller et al. | |
| 6,074,959 A | 6/2000 | Wang et al. | |
| 6,152,168 A | 11/2000 | Ohmi et al. | |
| 6,206,976 B1 | 3/2001 | Crevasse et al. | |
| 6,210,593 B1 | 4/2001 | Ohkuni et al. | |
| 6,217,937 B1 | 4/2001 | Shealy | |
| 6,231,716 B1 | 5/2001 | White et al. | |
| 6,264,467 B1 | 7/2001 | Lue et al. | |
| 6,294,466 B1 | 9/2001 | Chang | |
| 6,328,808 B1 | 12/2001 | Tsai et al. | |
| 6,376,386 B1 | 4/2002 | Oshima | |
| 6,492,774 B1 | 12/2002 | Han et al. | |
| 6,511,543 B1 | 1/2003 | Stauss et al. | |
| 6,589,352 B1 | 7/2003 | Yudovsky et al. | |
| 6,623,597 B1 | 9/2003 | Han et al. | |
| 6,709,547 B1 | 3/2004 | Ni et al. | |
| 6,722,642 B1 * | 4/2004 | Sutton | H01L 21/6838 |
| | | | 269/21 |
| 6,736,931 B2 | 5/2004 | Collins et al. | |
| 6,744,212 B2 | 6/2004 | Fischer et al. | |
| 6,818,560 B1 | 11/2004 | Koshimizu et al. | |
| 6,841,943 B2 | 1/2005 | Vahedi et al. | |
| 6,896,765 B2 | 5/2005 | Steger | |
| 6,898,558 B2 | 5/2005 | Klekotka | |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,311,784 B2 | 12/2007 | Fink | |
| 7,338,907 B2 | 3/2008 | Li et al. | |
| 7,378,128 B2 | 5/2008 | Rancoule | |
| 7,431,788 B2 | 10/2008 | Ricci et al. | |
| 7,481,944 B2 | 1/2009 | Nozawa et al. | |
| 7,736,998 B2 | 6/2010 | Morita et al. | |

| | | | |
|---|---|---|---|
| 7,757,541 B1 | 7/2010 | Monkowski et al. | |
| 7,758,698 B2 | 7/2010 | Bang et al. | |
| 7,882,800 B2 | 2/2011 | Koshiishi et al. | |
| 7,968,469 B2 | 6/2011 | Collins et al. | |
| 7,988,813 B2 | 8/2011 | Chen et al. | |
| 8,137,463 B2 | 3/2012 | Liu et al. | |
| 8,177,910 B2 | 5/2012 | Schmid et al. | |
| 8,291,935 B1 | 10/2012 | Merritt et al. | |
| 8,485,128 B2 | 7/2013 | Kellogg et al. | |
| 8,552,334 B2 | 10/2013 | Tappan et al. | |
| 8,555,920 B2 | 10/2013 | Hirata et al. | |
| 8,592,328 B2 | 11/2013 | Hausmann et al. | |
| 8,826,855 B2 | 9/2014 | Kellogg et al. | |
| 8,889,024 B2 | 11/2014 | Watanabe et al. | |
| 8,956,980 B1 | 2/2015 | Chen et al. | |
| 8,999,106 B2 | 4/2015 | Liu et al. | |
| 9,011,637 B2 | 4/2015 | Yamamoto | |
| 9,051,647 B2 | 6/2015 | Cooperberg et al. | |
| 9,059,678 B2 | 6/2015 | Long et al. | |
| 9,142,391 B2 | 9/2015 | Yamamoto | |
| 9,318,343 B2 | 4/2016 | Ranjan et al. | |
| 9,412,555 B2 | 8/2016 | Augustino et al. | |
| 9,471,065 B2 | 10/2016 | Koyomogi et al. | |
| 9,640,409 B1 | 5/2017 | Yang et al. | |
| 9,698,042 B1 | 7/2017 | Baldasseroni et al. | |
| 9,779,916 B2 | 10/2017 | Dhindsa et al. | |
| 10,096,471 B2 | 10/2018 | Canniff | |
| 10,410,832 B2 | 9/2019 | Zhang et al. | |
| 10,490,392 B2 | 11/2019 | Ishizawa | |
| 10,504,738 B2 | 12/2019 | Lin et al. | |
| 10,510,516 B2 | 12/2019 | Lin et al. | |
| 10,591,934 B2 | 3/2020 | Gopalakrishnan et al. | |
| 10,651,015 B2 | 5/2020 | Angelov et al. | |
| 10,699,878 B2 | 6/2020 | Caron et al. | |
| 10,825,659 B2 | 11/2020 | Treadwell et al. | |
| 11,798,789 B2 | 10/2023 | Sanchez et al. | |
| 2002/0043337 A1 | 4/2002 | Goodman et al. | |
| 2002/0053513 A1* | 5/2002 | Stimson | H01J 37/32431 |
| | | | 118/728 |
| 2002/0067585 A1 | 6/2002 | Fujiwara | |
| 2002/0092602 A1 | 7/2002 | Saito et al. | |
| 2003/0015141 A1 | 1/2003 | Takagi | |
| 2003/0186563 A1 | 10/2003 | Kobayashi et al. | |
| 2003/0196890 A1 | 10/2003 | Le et al. | |
| 2003/0231950 A1 | 12/2003 | Raaijmakers | |
| 2004/0003780 A1 | 1/2004 | Yudovsky et al. | |
| 2004/0060595 A1 | 4/2004 | Chittenden | |
| 2004/0173319 A1 | 9/2004 | Suzuki et al. | |
| 2005/0061447 A1 | 3/2005 | Kim et al. | |
| 2005/0133164 A1 | 6/2005 | Fischer et al. | |
| 2005/0194100 A1 | 9/2005 | Or et al. | |
| 2006/0283551 A1 | 12/2006 | Son | |
| 2007/0023398 A1 | 2/2007 | Kobayashi et al. | |
| 2007/0131350 A1* | 6/2007 | Ricci | H01L 21/68785 |
| | | | 156/86 |
| 2007/0283882 A1 | 12/2007 | Cho et al. | |
| 2007/0284344 A1 | 12/2007 | Todorov et al. | |
| 2008/0072823 A1 | 3/2008 | Yudovsky et al. | |
| 2008/0174387 A1 | 7/2008 | Chiang | |
| 2008/0236749 A1 | 10/2008 | Koshimizu et al. | |
| 2008/0261800 A1 | 10/2008 | Yuan et al. | |
| 2008/0314508 A1* | 12/2008 | Ricci | H01L 21/68785 |
| | | | 156/153 |
| 2008/0317564 A1 | 12/2008 | Cheng et al. | |
| 2009/0078196 A1 | 3/2009 | Midorikawa | |
| 2009/0162952 A1 | 6/2009 | Liu et al. | |
| 2009/0260982 A1 | 10/2009 | Riker et al. | |
| 2009/0279989 A1 | 11/2009 | Wong et al. | |
| 2010/0059181 A1 | 3/2010 | Lee et al. | |
| 2010/0108261 A1* | 5/2010 | Augustino | H01J 37/32642 |
| | | | 156/345.1 |
| 2010/0122655 A1 | 5/2010 | Tiner et al. | |
| 2010/0144539 A1 | 6/2010 | Bergh et al. | |
| 2010/0145633 A1 | 6/2010 | Yasuda | |
| 2010/0178770 A1 | 7/2010 | Zin | |
| 2010/0197070 A1 | 8/2010 | Stoddard et al. | |
| 2010/0216313 A1 | 8/2010 | Iwai | |
| 2010/0229976 A1 | 9/2010 | Hirata et al. | |
| 2010/0264117 A1 | 10/2010 | Ohmi et al. | |

(56) References Cited

U.S. PATENT DOCUMENTS

| | | |
|---|---|---|
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0031111 A1 | 2/2011 | Kobayashi |
| 2011/0094596 A1 | 4/2011 | Sugiyama et al. |
| 2011/0108524 A1 | 5/2011 | Dhindsa et al. |
| 2011/0126984 A1* | 6/2011 | Kang ............... H01J 37/32642 |
| | | 156/345.51 |
| 2011/0135821 A1 | 6/2011 | Ding |
| 2011/0157760 A1* | 6/2011 | Willwerth ........... H01L 21/6833 |
| | | 361/234 |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0176692 A1 | 7/2012 | Yamawaku et al. |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0334038 A1 | 12/2013 | Riker et al. |
| 2014/0017900 A1* | 1/2014 | Doba ............... H01J 37/32091 |
| | | 156/345.28 |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1 | 8/2014 | McMillin et al. |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0010381 A1 | 1/2015 | Cai |
| 2015/0017810 A1 | 1/2015 | Guha |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0107773 A1 | 4/2015 | Shintaku et al. |
| 2015/0179412 A1* | 6/2015 | Chhatre ............ H01J 37/32642 |
| | | 156/345.52 |
| 2015/0181684 A1 | 6/2015 | Banna et al. |
| 2015/0184287 A1 | 7/2015 | Tsung et al. |
| 2015/0187631 A1 | 7/2015 | Ranish et al. |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0046451 A1 | 2/2016 | German |
| 2016/0099162 A1 | 4/2016 | Ng et al. |
| 2016/0111258 A1 | 4/2016 | Taskar et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2016/0307742 A1 | 10/2016 | Mishra et al. |
| 2016/0372321 A1 | 12/2016 | Krishnan et al. |
| 2017/0011892 A1 | 1/2017 | Guo et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0113355 A1 | 4/2017 | Genetti et al. |
| 2017/0115657 A1* | 4/2017 | Trussell ............ H01L 21/67167 |
| 2017/0125274 A1* | 5/2017 | Swaminathan ..... H01L 21/6833 |
| 2017/0133283 A1 | 5/2017 | Kenworthy |
| 2017/0200586 A1 | 7/2017 | Treadwell et al. |
| 2017/0213751 A1 | 7/2017 | Oohashi |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1 | 2/2018 | Zhang et al. |
| 2018/0114716 A1 | 4/2018 | Hao et al. |
| 2018/0138069 A1 | 5/2018 | Tan et al. |
| 2018/0155838 A1 | 6/2018 | Rasheed et al. |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |

(56) References Cited

U.S. PATENT DOCUMENTS

| | | |
|---|---|---|
| 2019/0027988 A1 | 1/2019 | Filipenko et al. |
| 2019/0103722 A1 | 4/2019 | Kieu |
| 2019/0228952 A1 | 7/2019 | Dorf et al. |
| 2019/0279888 A1 | 9/2019 | Gopalakrishnan et al. |
| 2019/0363003 A1 | 11/2019 | Sarode Vishwanath |
| 2020/0004954 A1 | 1/2020 | Zawadowskiy et al. |
| 2020/0020565 A1 | 1/2020 | Rathnasinghe et al. |
| 2020/0049547 A1 | 2/2020 | Spyropoulos et al. |
| 2020/0234928 A1 | 7/2020 | Vishwanath |
| 2020/0234981 A1 | 7/2020 | Schmid et al. |
| 2020/0303224 A1* | 9/2020 | Yoshimori ........ H01L 21/67259 |
| 2020/0312633 A1* | 10/2020 | Rathnasinghe ... H01J 37/32642 |
| 2020/0328105 A1 | 10/2020 | Sun et al. |
| 2020/0395195 A1 | 12/2020 | Sanchez et al. |
| 2021/0057256 A1 | 2/2021 | Bergantz et al. |
| 2021/0066052 A1 | 3/2021 | Emura |
| 2021/0111007 A1 | 4/2021 | Kim et al. |
| 2021/0291374 A1 | 9/2021 | Bergantz et al. |
| 2021/0327688 A1 | 10/2021 | Sasaki et al. |
| 2021/0384013 A1 | 12/2021 | Jung et al. |
| 2022/0122878 A1 | 4/2022 | Wu et al. |
| 2022/0246408 A1 | 8/2022 | Genetti et al. |
| 2022/0254612 A1 | 8/2022 | Kimball et al. |
| 2022/0319904 A1 | 10/2022 | Rice et al. |
| 2022/0359169 A1 | 11/2022 | Koai et al. |

FOREIGN PATENT DOCUMENTS

| | | |
|---|---|---|
| CN | 1701421 A | 11/2005 |
| CN | 101238553 A | 8/2008 |
| CN | 101552182 A | 10/2009 |
| CN | 102187741 A | 9/2011 |
| CN | 102243977 A | 11/2011 |
| CN | 202076225 U | 12/2011 |
| CN | 102315150 A | 1/2012 |
| CN | 102610476 A | 7/2012 |
| CN | 102714146 A | 10/2012 |
| CN | 203174197 U | 9/2013 |
| CN | 103730318 A | 4/2014 |
| CN | 104012185 A | 8/2014 |
| CN | 203895409 U | 10/2014 |
| CN | 104205320 A | 12/2014 |
| CN | 104205321 A | 12/2014 |
| CN | 104299929 A | 1/2015 |
| CN | 104752141 A | 7/2015 |
| CN | 104851832 A | 8/2015 |
| CN | 105336561 A | 2/2016 |
| CN | 105810609 A | 7/2016 |
| CN | 105814243 A | 7/2016 |
| CN | 106057616 A | 10/2016 |
| CN | 106469637 A | 3/2017 |
| CN | 107086168 A | 8/2017 |
| CN | 107093569 A | 8/2017 |
| CN | 107112265 A | 8/2017 |
| CN | 107768275 A | 3/2018 |
| CN | 108369922 A | 8/2018 |
| CN | 112563108 A | 3/2021 |
| CN | 212874484 U | 4/2021 |
| EP | 0424299 A2 | 4/1991 |
| EP | 0821403 A2 | 1/1998 |
| EP | 0821404 A2 | 1/1998 |
| EP | 0838842 A2 | 4/1998 |
| EP | 0875919 A2 | 11/1998 |
| EP | 0875979 A1 | 11/1998 |
| EP | 1202328 A2 | 5/2002 |
| JP | H0293063 A | 4/1990 |
| JP | H07106316 A | 4/1995 |
| JP | H07221024 A | 8/1995 |
| JP | 10-070088 | 3/1998 |
| JP | H10-280173 A | 10/1998 |
| JP | 200049207 A | 2/2000 |
| JP | 2000036488 A | 2/2000 |
| JP | 20000124141 A | 4/2000 |
| JP | 3076791 B2 | 8/2000 |
| JP | 2001-230239 A | 8/2001 |
| JP | 2001522142 A | 11/2001 |
| JP | 2002500439 A | 1/2002 |
| JP | 2002503765 A | 2/2002 |
| JP | 2002-176030 A | 6/2002 |
| JP | 2002-217171 A | 8/2002 |
| JP | 2002-231794 A | 8/2002 |
| JP | 2003-513434 A | 4/2003 |
| JP | 2004-266127 A | 9/2004 |
| JP | 2004296553 A | 10/2004 |
| JP | 2005539397 A | 12/2005 |
| JP | 2006173223 A | 6/2006 |
| JP | 2006186171 A | 7/2006 |
| JP | 2006-344701 A | 12/2006 |
| JP | 2007207808 A | 8/2007 |
| JP | 2007-234867 A | 9/2007 |
| JP | 2007321244 A | 12/2007 |
| JP | 2007535819 A | 12/2007 |
| JP | 2008027936 A | 2/2008 |
| JP | 2008159931 A | 7/2008 |
| JP | 2008-244274 A | 10/2008 |
| JP | 2008-251681 A | 10/2008 |
| JP | 2010034416 A | 2/2010 |
| JP | 2010267894 A | 11/2010 |
| JP | 2011-54933 A | 3/2011 |
| JP | 2011151263 A | 8/2011 |
| JP | 2011210853 A | 10/2011 |
| JP | 2012-049376 A | 3/2012 |
| JP | 201264671 A | 3/2012 |
| JP | 2012507860 A | 3/2012 |
| JP | 2012-146743 A | 8/2012 |
| JP | 2012216614 A | 11/2012 |
| JP | 2012222235 A | 11/2012 |
| JP | 201342012 A | 2/2013 |
| JP | 2013511847 A | 4/2013 |
| JP | 2013526063 A | 6/2013 |
| JP | 2013530516 A | 7/2013 |
| JP | 2013172013 A | 9/2013 |
| JP | 201490177 A | 5/2014 |
| JP | 2014084523 A | 5/2014 |
| JP | 2014232884 A | 12/2014 |
| JP | 20155755 A | 1/2015 |
| JP | 2015050156 A | 3/2015 |
| JP | 2015109249 A | 6/2015 |
| JP | 2015109479 A | 6/2015 |
| JP | 2015115421 A | 6/2015 |
| JP | 5767373 B2 | 8/2015 |
| JP | 2015201552 A | 11/2015 |
| JP | 2016046451 A | 4/2016 |
| JP | 2016-146472 A | 8/2016 |
| JP | 2016-219820 A | 12/2016 |
| JP | 3210105 U | 4/2017 |
| JP | 2017085072 A | 5/2017 |
| JP | 2017092435 A | 5/2017 |
| JP | 2017092448 A | 5/2017 |
| JP | 2017131927 A | 8/2017 |
| JP | 2017183701 A | 10/2017 |
| JP | 2018010992 A | 1/2018 |
| JP | 2018098187 A | 6/2018 |
| JP | 2018098239 A | 6/2018 |
| JP | 2018125519 A | 8/2018 |
| JP | 2018160666 A | 10/2018 |
| JP | 2019505088 A | 2/2019 |
| JP | 2019192734 A | 10/2019 |
| JP | 2019201085 A | 11/2019 |
| JP | 2019208023 A | 12/2019 |
| JP | 2019220691 A | 12/2019 |
| JP | 2020043137 A | 3/2020 |
| JP | 2020519016 A | 6/2020 |
| JP | 2020115541 A | 7/2020 |
| JP | 2022031361 A | 2/2022 |
| KR | 10-1998-0086673 A | 12/1998 |
| KR | 20010112277 A | 12/2001 |
| KR | 20020002704 A | 1/2002 |
| KR | 20020031417 A | 5/2002 |
| KR | 1020020031417 A | 5/2002 |
| KR | 20020071398 A | 9/2002 |
| KR | 20030065126 A | 8/2003 |
| KR | 20040050080 A | 6/2004 |
| KR | 20050008792 A | 1/2005 |

(56) References Cited

FOREIGN PATENT DOCUMENTS

| | | | | | |
|---|---|---|---|---|---|
| KR | 20050038898 | A | 4/2005 | | |
| KR | 100578129 | B1 * | 5/2006 | ........ | H01J 37/32623 |
| KR | 20070073704 | A | 7/2007 | | |
| KR | 100783062 | B1 | 12/2007 | | |
| KR | 100803858 | B1 | 2/2008 | | |
| KR | 20080013552 | A | 2/2008 | | |
| KR | 20080023569 | A | 3/2008 | | |
| KR | 100849179 | B1 | 7/2008 | | |
| KR | 20090024075 | A | 3/2009 | | |
| KR | 20090080520 | A | 7/2009 | | |
| KR | 1020090080520 | A | 7/2009 | | |
| KR | 20090094290 | A | 9/2009 | | |
| KR | 2010-0105695 | A | 9/2010 | | |
| KR | 20100123724 | A | 11/2010 | | |
| KR | 20110005665 | U | 6/2011 | | |
| KR | 2011-0125188 | A | 11/2011 | | |
| KR | 20110123519 | A | 11/2011 | | |
| KR | 20110137775 | A | 12/2011 | | |
| KR | 20130124616 | A | 11/2013 | | |
| KR | 20130137962 | A | 12/2013 | | |
| KR | 20140001540 | A | 1/2014 | | |
| KR | 20140014005 | | 2/2014 | | |
| KR | 2014-0101870 | A | 8/2014 | | |
| KR | 2014-0103872 | A | 8/2014 | | |
| KR | 2014-0132542 | A | 11/2014 | | |
| KR | 20160014088 | A | 2/2016 | | |
| KR | 10-2016-0063412 | A | 6/2016 | | |
| KR | 20167013192 | | 6/2016 | | |
| KR | 10-2016-0088820 | A | 7/2016 | | |
| KR | 20160088820 | A | 7/2016 | | |
| KR | 20170037526 | A | 4/2017 | | |
| KR | 20170130284 | A | 11/2017 | | |
| KR | 20180099776 | A | 9/2018 | | |
| KR | 101927936 | B1 | 12/2018 | | |
| KR | 20190017721 | A | 2/2019 | | |
| KR | 20190026898 | A | 3/2019 | | |
| KR | 10-1974422 | B1 | 5/2019 | | |
| KR | 101974420 | B1 | 5/2019 | | |
| KR | 20190068490 | A | 6/2019 | | |
| TW | 506234 | B | 10/2002 | | |
| TW | 200302035 | A | 7/2003 | | |
| TW | 200520137 | A | 6/2005 | | |
| TW | 200525635 | A | 8/2005 | | |
| TW | I267563 | B | 12/2006 | | |
| TW | 201001588 | A | 1/2010 | | |
| TW | 201207933 | A | 2/2012 | | |
| TW | 201243942 | A | 11/2012 | | |
| TW | 201246327 | A | 11/2012 | | |
| TW | 201324653 | A | 6/2013 | | |
| TW | 201347063 | A | 11/2013 | | |
| TW | 201351532 | A | 12/2013 | | |
| TW | 201411719 | A | 3/2014 | | |
| TW | 201426854 | A | 7/2014 | | |
| TW | 201436089 | A | 9/2014 | | |
| TW | 201447965 | A | 12/2014 | | |
| TW | 201503209 | A | 1/2015 | | |
| TW | M492915 | U | 1/2015 | | |
| TW | 201528310 | A | 7/2015 | | |
| TW | 201532106 | A | 8/2015 | | |
| TW | 201601208 | A | 1/2016 | | |
| TW | 201626427 | A | 7/2016 | | |
| TW | 201630107 | A | 8/2016 | | |
| TW | 201639074 | A | 11/2016 | | |
| TW | 201719709 | A | 6/2017 | | |
| TW | 201724345 | A | 7/2017 | | |
| TW | 201737290 | A | 10/2017 | | |
| TW | 201817899 | A | 5/2018 | | |
| TW | 201926536 | A | 7/2019 | | |
| TW | 201935593 | A | 9/2019 | | |
| WO | WO-0040776 | A1 | 7/2000 | | |
| WO | WO-0113404 | A1 | 2/2001 | | |
| WO | WO-2007008509 | A2 | 1/2007 | | |
| WO | WO-2009086109 | A2 | 7/2009 | | |
| WO | WO-2011051251 | A1 | 5/2011 | | |
| WO | WO-2013108750 | A1 | 7/2013 | | |
| WO | WO-2013123617 | A1 | 8/2013 | | |
| WO | WO-2014068886 | A1 | 5/2014 | | |
| WO | WO-2014163742 | A1 | 10/2014 | | |
| WO | WO-2014209492 | A1 | 12/2014 | | |
| WO | WO-2017131927 | A1 | 8/2017 | | |
| WO | 2017155812 | A1 | 9/2017 | | |
| WO | WO-2018010986 | A1 | 1/2018 | | |
| WO | WO-2019022707 | A1 | 1/2019 | | |
| WO | WO-2019022708 | A1 | 1/2019 | | |
| WO | WO-2019103722 | A1 | 5/2019 | | |
| WO | WO-2019112903 | A1 | 6/2019 | | |
| WO | WO-2019143858 | A1 | 7/2019 | | |
| WO | WO-2020036613 | A1 | 2/2020 | | |
| WO | WO-2020-180656 | A1 | 9/2020 | | |
| WO | WO-2021025934 | A1 | 2/2021 | | |
| WO | WO-2021026110 | A1 | 2/2021 | | |
| WO | WO-2021030184 | A1 | 2/2021 | | |
| WO | WO-2021-167897 | A1 | 8/2021 | | |
| WO | WO-2021-194470 | A1 | 9/2021 | | |
| WO | WO-2022076227 | A1 | 4/2022 | | |

OTHER PUBLICATIONS

International Search Report and Written Opinion issued in PCT/US2017/043527, mailed Apr. 20, 2018; ISA/KR.

Search Report dated Sep. 7, 2020 corresponding to European Application No. 17 919 402.2, 9 pages.

Machine Translation of Notice of Reasons for Refusal corresponding to Japanese Patent Application No. 2019-559033 dated Dec. 22, 2020, 4 pages.

Translation of Written Opinion corresponding to Singapore Application No. 11201907515W dated Mar. 15, 2020, 4 pages.

Translation of Notification of Examination Opinions dated May 4, 2020 corresponding to Taiwanese Patent Application No. 106142110, 7 pages.

Translation of Notification of Office Action dated Dec. 17, 2019 corresponding to Korean Patent Application No. 10-2018-7021511, 2 pages.

Translation of Notification of Office Action dated Jun. 26, 2020 corresponding to Korean Patent Application No. 10-2018-7021511, 2 pages.

Search Report dated Feb. 19, 2020 corresponding to European Application No. 17 932 862.0, 7 pages.

Office Action dated Dec. 1, 2020 corresponding to Japanese Application No. 2019-553416, 4 pages.

Translation of Decision of Refusal dated Feb. 3, 2021 corresponding to Taiwanese Patent Application No. 106142110, 4 pages.

Translation of Decision for Grant of Patent dated Jul. 28, 2020 corresponding to Korean Application No. 10-2018-7021879, 1 page.

Translation of Written Opinion corresponding to Singapore Application No. 11201908264Q dated Feb. 19, 2020, 7 pages.

Translation of Notification of Office Action dated Dec. 19, 2019 corresponding to Korean Patent Application No. 10-2018-7021879, 7 pages.

Translation of Notification of Office Action dated Mar. 29, 2020 corresponding to Korean Patent Application No. 10-2020-7004813, 3 pages.

Translation of Decision for Grant of Patent dated Feb. 24, 2021 corresponding to Korean Application No. 10-2020-7013289, 1 page.

Translation of Notification of Office Action dated Aug. 27, 2021 corresponding to Korean Patent Application No. 10-2021-7014539, 8 pages.

Decision for Grant of Patent for Korean Application No. 10-2021-7014539 dated Feb. 23, 2022.

Notice of Reasons for Refusal for Japanese Application No. 2021-75777 dated Jul. 12, 2022.

U.S. Appl. No. 16/960,818, filed Jul. 8, 2020, Alejandro Sanchez.

U.S. Appl. No. 17/181,571, filed Feb. 22, 2021, Haoquan Yan.

International Search Report and Written Opinion of the ISA issued in PCT/US2020/045389, mailed Nov. 17, 2020; ISA/KR.

Translation of Second Office Action dated Feb. 16, 2021 corresponding to Japanese Application No. 2017-039058, 4 pages.

(56) References Cited

OTHER PUBLICATIONS

First Office Action corresponding to Taiwanese Patent Application No. 106106790 dated Oct. 7, 2020, 7 pages.
First Office Action corresponding to Chinese Patent Application No. 201710122891.1 dated Apr. 10, 2020, 14 pages.
Second Office Action corresponding to Chinese Patent Application No. 201710122891.1 dated Dec. 3, 2020, 5 pages.
MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020 [LAMRP146].
Blain et al. (Jul./Aug. 1996) "Role of nitrogen in the downstream etching of silicon nitride," Journal of Vacuum Science & Technology A, 14(4):2151-2157.
Blain (Mar./ Apr. 1999) "Mechanism of nitrogen removal from silicon nitride by nitric oxide," Journal of Vacuum Science & Technology A, 17(2):665-667.
Kastenmeier et al. (Nov./Dec. 1999) "Highly selective etching of silicon nitride over silicon and silicon dioxide," J. Vac. Sci. Techno!. A, American Vacuum Society, 17 (6):3179-3184.
Kastenmeier et al. (Sep./Oct. 1996) "Chemical dry etching of silicon nitride and silicon dioxide using CF4/02/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.
US Final Ofice Action dated Feb. 26, 2016 issued in U.S. Appl. No. 14/576,020 [LAMRP146].
US Office Action dated Sep. 23, 2016 issued in U.S. Appl. No. 14/576,020 [LAMRP146].
European Extended Search Report dated May 30, 2016 issued in EP 15 199 363.1 [LAMRP146EP].
U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).
U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).
First Chinese Office Action for Chinese Application No. 201710013856.6 dated Oct. 21, 2019.
First Chinese Office Action for Chinese Application No. CN201710076420.1 issued Dec. 17, 2019. No translation provided. 11 pages.
First Office Action corresponding to Japanese Application No. 2018-186353, dated Jan. 21, 2020, 8 pages.
First Office Action corresponding to Japanese Application No. 2016-004302, dated Jan. 28, 2020, 4 pages.
First Office Action corresponding to Tiawanese Application No. 106104190, dated Sep. 4, 2020, 5 pages.
Office Action issued in corresponding Japanese Patent Application 2016-143886 dated Sep. 8, 2020.
Translation of First Office Action dated Sep. 28, 2020 corresponding to Korean Patent Application No. 10-2018-0114808, 3 pages.

Translation of Notification of Examination Opinions corresponding to Taiwanese Patent Application No. 106101332 dated Nov. 19, 2020, 9 pages.
D. A. Jobson. "On the Flow of a Compressible Fluid through Orifices." Proceedings of the Institution of Mechanical Engineers. 169[1](1955). pp. 767-776. https://doi.org/10.1243/PIME_PROC_1955_169_077_02 (Year: 1955).
Cashco, Inc. "Fluid Flow Basics ofThrottling Valves." 1999. pp. 1-56. Available Mar. 24, 2020 online at: https://www.controlglobal.com/assets/Media/MediaManager/RefBook_ Cash co_Fluid. pdf. (Year: 1999).
O'Keefe Controls Co. "Choked Flow of Gases." in Catalog 11. 2003. pp. 20-24 & 48. (Year: 2003).
Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
Notification of Examination Opinions corresponding to Taiwanese U.S. Appl. No. 10/512,352 dated Feb. 19, 2020, 5 pages.
First Office Action dated Mar. 17, 2020 corresponding to Chinese Patent Application 20170076027.2, 8 pages.
First Office Action with Translation dated Sep. 7, 2021 corresponding to Korean Patent Application No. 10-2017-0083210, 6 pages.
First Office Action with Translation dated Oct. 7, 2021 corresponding to Japanese Patent Application No. 2017-154893, 7 pages.
Notification of Search Report corresponding to Singapore Patent Application No. 10201808035Y dated Oct. 20, 2022, 11 pages.
Office Action dated May 29, 2023 from Korean Patent Office for Korean Patent Application No. 10-2021-0079769; 8 pages.
International Search Report and Written Opinon for PCT Applicaiton No. PCT/US2019/045085 dated Dec. 20, 2019.
Notification of Transmittal of International Search Report and the Written Opinion of the International Searching Authority dated Feb. 22, 2018, 16 pages.
International Search Report and Written Opinion of the ISA issued in PCT/US2018/050273, mailed May 13, 2019; ISA/KR.
Notice of Reason for Refusal issued in corresponding Japanese patent application No. 2019-505020 dated Oct. 16, 2020.
Office Action issued in corresponding Korean Patent Application No. 10-2018-7028683 dated Nov. 26, 2020.
Office Action issued in corresponding Taiwanese Patent Application No. 10-2018-7028683 dated Nov. 26, 2020.
Office Action issued in corresponding Taiwanese Patent Application No. 109128923 dated May 11, 2021 (4 pages).
Office Action issued in corresponding Korean Patent Application No. 10-2018-7028683 dated Apr. 27, 2022.
Supplementary Partial European Search Report issued in corresponding European Patent Application No. 18929891 dated Mar. 18, 2022.
Office Action issued in corresponding Korean Patent Application 10-2018-7028683 dated Dec. 29, 2022.
Office Action issued in corresponding Japanese Patent Application 2022-31361 dated Jan. 17, 2023 (No English translation available).
Office Action issued in corresponding Taiwanese Patent Application 111104002 dated Mar. 6, 2023.
Office Action issued in corresponding Chinese Patent Application 201880002160.6 dated Mar. 23, 2023.
International Search Report and Written Opinion of the ISA issued in PCT/US2020/044168, mailed Nov. 17, 2020; ISA/KR.
International Search Report and Written Opinion of the ISA issued in PCT/US2020/024333, mailed Dec. 24, 2020; ISA/KR.
International Search Report and Written Opinion of the ISA issued in PCT/US2021/052732, mailed Jan. 21, 2022; ISA/KR.
Supplementary Partial European Search Report issued in corresponding European Patent Application No. 20850609 dated MAug. 3, 2023.
Taiwanese Office Action for Taiwanese Application No. 110126786 dated Oct. 16, 2023.
Korean Notice of Preliminary Examination Result for Korean Application No. 10-2023-7037853 dated Dec. 6, 2023.
Taiwanese Office Action for Taiwanese Application No. 109109974 dated Jan. 4, 2024.

(56)            References Cited

OTHER PUBLICATIONS

Examination Report issued in corresponding European Patent Application 18929891.2 dated Mar. 7, 2023.
Taiwanese Office Action for Taiwanese Application No. 111104002 dated Mar. 8, 2023.
Notice of Reason for Refusal issued in corresponding Japanese patent application No. 2022-31361dated Jan. 17, 2023.
European Extended Search Report dated Jun. 6, 2022 issued in EP 18929891.2.
Notice of Reason for Refusal issued in corresponding Japanese patent application No. 2022-31361dated Jun. 20, 2023.
Office Action issued in corresponding Korean Patent Application No. 10-2018-7028683 dated Dec. 29, 2022.
Office Action issued in corresponding Korean Patent Application 10-2018-7028683 dated May 2, 2023.
Office Action issued in corresponding Korean Patent Application 10-2021-7027521 dated Dec. 20, 2021.
Office Action dated Oct. 10, 2023 from Korean Patent Office for Korean Patent Application No. 10-2023-7023024.
Office Action issued in corresponding Korean Patent Application 1020170018561 mailed May 21, 2024.
Office Action issued in corresponding Korean Patent Application No. 1020170018549 dated May 28, 2024.
O.W. Purbo et al., 'Reactive Ion Etching of SOI (SIMOX and ZMR) Silicon in Nitrogen Containing $CF_4+O_2$ and $SF_6+O_2$ Plasmas', the J. Electrochem. Soc., (Sep. 30, 1993).
L. Jiang et al., 'Impact of Ar addition to inductively coupled plasma etching of SiC in SF6/O2', Microelectron. Eng., (Mar. 18, 2004).
Office Action issued in corresponding Korean Patent Application 1020170013979 dated May 29, 2024.
U.S. Appl. No. 17/681,606, filed Feb. 25, 2022, Hiran Rajitha Rathnasinghe.
Decision to Grant for Japanese Application No. 2022-557679 dated Feb. 28, 2024.
European Examination Report for European Application No. 21161965.5 dated Jul. 27, 2023.
Extended European Search Report from European Application No. 22156901.5 dated Jun. 27, 2022.
First Office Action from Corresponding Taiwanese Application No. 109126470 dated Jun. 28, 2024.
Japanese Office Action and Search Report for Japanese Application No. 2022-508752 dated Jul. 25, 2024.
Korean Decision for Grant of Patent for Korean Application No. 10-2023-7035339 dated Jul. 30, 2024.
Office Action from corresponding Korean Application No. 10-2022-7007791, dated Jul. 22, 2024.
Search Report from corresponding Korean Application No. 10-2023-7037449, dated Nov. 16, 2023.
Chinese Office Action for Chinese Application No. 202080057245.1 dated Oct. 17, 2024.
Decision to Grant for Japanese Application No. 2023-11469 dated Apr. 10, 2024.
International Search Report and Written Opinion of the ISA issued in PCT/US2022/043617, mailed Mar. 30, 2023; ISA/KR.
Japanese Office Action for Japanese Application No. 2023-129731 dated Sep. 10, 2024.
Office Action from corresponding Chinese Application No. 202210228466.1, dated Oct. 30, 2024.
Office Action from corresponding Korean Application No. 10-2022-7007496, dated Aug. 21, 2024.
Office Action from corresponding Taiwanese Application No. 112149171, dated Nov. 13, 2024.
U.S. Appl. No. 18/879,860, filed Dec. 30, 2024, Christopher Kimball.
U.S. Appl. No. 18/990,129, filed Dec. 20, 2024, Hiran Rajitha Rathnasinghe.
U.S. Appl. No. 16/487,703, filed Aug. 21, 2019, Hiran Rajitha Rathnasinghe.
U.S. Appl. No. 16/497,091 filed Sep. 24, 2019, Hiran Rajitha Rathnasinghe.
U.S. Appl. No. 17/631,984, filed Feb. 1, 2022, Hui Ling Han.
U.S. Appl. No. 17/633,727, filed Feb. 8, 2022, Rohini Mishra.
U.S. Appl. No. 17/671,211, filed Feb. 14, 2022, Christopher Kimball.
U.S. Appl. No. 17/913,008 filed Sep. 20, 2022, Hui Ling Han.
U.S. Appl. No. 18/029,708, filed Mar. 31, 2023, Christopher Kimball.
U.S. Appl. No. 18/377,141, filed Oct. 5, 2023, Alejandro Sanchez.
U.S. Appl. No. 18/758,576, filed Jun. 28, 2024.
Allowanced issued in corresponding Korean Application No. 1020170018561 dated Jan. 15, 2025.
Chinese Office Action for Chinese Application No. 201780089345 dated Jun. 5, 2023.
Chinese Office Action for Chinese Application No. 201780089345 dated Nov. 18, 2022.
Chinese Office Action for Chinese Application No. 202210228466.1 dated Aug. 1, 2025.
Decision to Grant a Patent in Japanese Application No. 20220264247, dated Feb. 25, 2025.
Decision to Grant for Japanese Application No. 2024-59272 May 7, 2025.
Decision to Grant for Japanese Application No. 2024-75662 dated Mar. 27, 2025.
Extended European Search Report from corresponding European Application No. 22156901.5 dated Jun. 27, 2022.
International Search Report and Written Opinion of the ISA issued in PCT/US2020/044816, mailed Nov. 13, 2020; ISA/KR.
Japanese Allowance for Japanese Application No. 2023-11469 dated Apr. 5, 2024.
Japanese Decision to Grant a Patent for Japanese Application No. 2023-521034 dated Aug. 27, 2025.
Japanese Office Action for Japanese Application No. 2023-129731 drafted Mar. 18, 2025.
Japanese Office Action for Japanese Application No. 2023-129731 mailed Aug. 19, 2025.
Korean Office Action for Korean Application No. 10-2023-7015468 mailed Mar. 21, 2025.
Korean Office Action for Korean Application No. 10-2024-7036134 mailed Apr. 18, 2025.
Office Action for corresponding Korean App. No. 1020237023024 mailed on Mar. 26, 2025.
Office Action from corresponding Korean Application No. 10-2023-7037449, dated Jul. 22, 2024.
Search Report from corresponding Singaporean Application No. 11202201065W, dated May 28, 2024.
Taiwanese Office Action for Taiwanese Application No. 110136825 dated Jan. 16, 2025.
Taiwanese Office Action for Taiwanese Application No. 112123427 dated Aug. 2, 2024.
Taiwanese Office Action from corresponding Taiwanese Application No. 109126470 dated Jun. 28, 2024.

* cited by examiner

BOTTOM AND MIDDLE EDGE RINGS

CROSS-REFERENCE TO RELATED APPLICATIONS

The present disclosure is a divisional of U.S. patent application Ser. No. 16/487,703, filed on Aug. 21, 2019, which is a National Stage of International Application PCT/US2017/062769, filed on Nov. 21, 2017. The entire disclosures of the applications referenced above are incorporated herein by reference.

FIELD

The present disclosure relates to moveable edge rings in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A bottom ring is configured to support a moveable edge ring. The edge ring is configured to be raised and lowered relative to a substrate support. The bottom ring includes an upper surface that is stepped, an annular inner diameter, an annular outer diameter, a lower surface, and a plurality of vertical guide channels provided through the bottom ring from the lower surface to the upper surface of the bottom ring. Each of the guide channels includes a first region having a smaller diameter than the guide channel, and the guide channels are configured to receive respective lift pins for raising and lowering the edge ring.

In other features, a diameter of the guide channel is between 0.063" and 0.067". Each of the guide channels includes a cavity on the lower surface of the bottom ring, wherein the cavities have a diameter greater than the guide channels. Transitions between the guide channels and the cavities are chamfered. The chamfered transitions have a height and width between 0.020" and 0.035" and an angle between 40° and 50°. An inner diameter of a step in the upper surface is at least 13.0".

In other features, the bottom ring includes a guide feature extending upward from the upper surface of the bottom ring. The guide channels pass through the guide feature. The guide feature includes the first regions of the guide channels. The upper surface includes an inner annular rim, and wherein the guide feature and the inner annular rim define a groove. A height of the guide feature is greater than a height of the inner annular rim. At least one of a first upper corner and a second upper corner of the guide feature is chamfered. The upper surface includes an inner annular rim and an outer annular rim, wherein the guide feature and the inner annular rim define a first groove, and wherein the guide feature and the outer annular rim define a second groove.

In other features, the upper surface includes at least two changes in direction. The upper surface includes at least five changes of direction. The upper surface includes at least five alternating vertical and horizontal paths. The bottom ring has a first outer diameter and a second outer diameter greater than the first outer diameter. The bottom ring includes an annular lip extending radially outward from an outer diameter of the bottom ring. The lower surface includes a plurality of cavities configured to be aligned with bolt holes in a baseplate of the substrate support.

A middle ring is configured to be arranged on a bottom ring and to support a moveable edge ring. The edge ring is configured to be raised and lowered relative to a substrate support. The middle ring includes an upper surface that is stepped, an annular inner diameter, an annular outer diameter, a lower surface, a guide feature defining the annular outer diameter, an inner annular rim defining the annular inner diameter, and a groove defined between the guide feature and the inner annular rim.

In other features, at least one of a first upper corner and a second upper corner of the guide feature is chamfered. The middle ring is "U"-shaped. The upper surface includes at least four changes of direction. The upper surface includes at least five alternating vertical and horizontal surfaces.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support in a substrate processing system may include an edge ring. An upper surface of the edge ring may extend above an upper surface of the substrate support, causing the upper surface of the substrate support (and, in some examples, an upper surface of a substrate arranged on the substrate support) to be recessed relative to the edge ring. This recess may be referred to as a pocket. A distance between the upper surface of the edge ring and the upper surface of the substrate may be referred to as a "pocket depth." Generally, the pocket depth is fixed according to a height of the edge ring relative to the upper surface of the substrate.

Some aspects of etch processing may vary due to characteristics of the substrate processing system, the substrate, gas mixtures, etc. For example, flow patterns, and therefore an etch rate and etch uniformity, may vary according to the pocket depth of the edge ring, edge ring geometry (i.e., shape), as well as other variables including, but not limited to, gas flow rates, gas species, injection angle, injection position, etc. Accordingly, varying the configuration of the edge ring (e.g., including edge ring height and/or geometry) may modify the gas velocity profile across the surface of the substrate.

Some substrate processing systems may implement moveable (e.g., tunable) edge rings and/or replaceable edge rings. In one example, a height of a moveable edge may be adjusted during processing to control etch uniformity. The edge ring may be coupled to an actuator configured to raise and lower the edge ring in response to a controller, user interface, etc. In one example, a controller of the substrate processing system controls the height of the edge ring during a process, between process steps, etc. according to a particular recipe being performed and associated gas injection parameters. Further, edge rings and other components may comprise consumable materials that wear/erode over time. Accordingly, the height of the edge ring may be adjusted to compensate for erosion. In other examples, edge rings may be removable and replaceable (e.g., to replace eroded or damaged edge rings, to replace an edge ring with an edge ring having different geometry, etc.). Examples of substrate processing systems implementing moveable and replaceable edge rings can be found in U.S. patent application Ser. No. 14/705,430, filed on May 6, 2015, the entire contents of which are incorporated herein by reference.

Substrate processing systems and methods according to the principles of the present disclosure include middle edge rings and bottom edge rings configured to support movable top edge rings.

Figure 1:
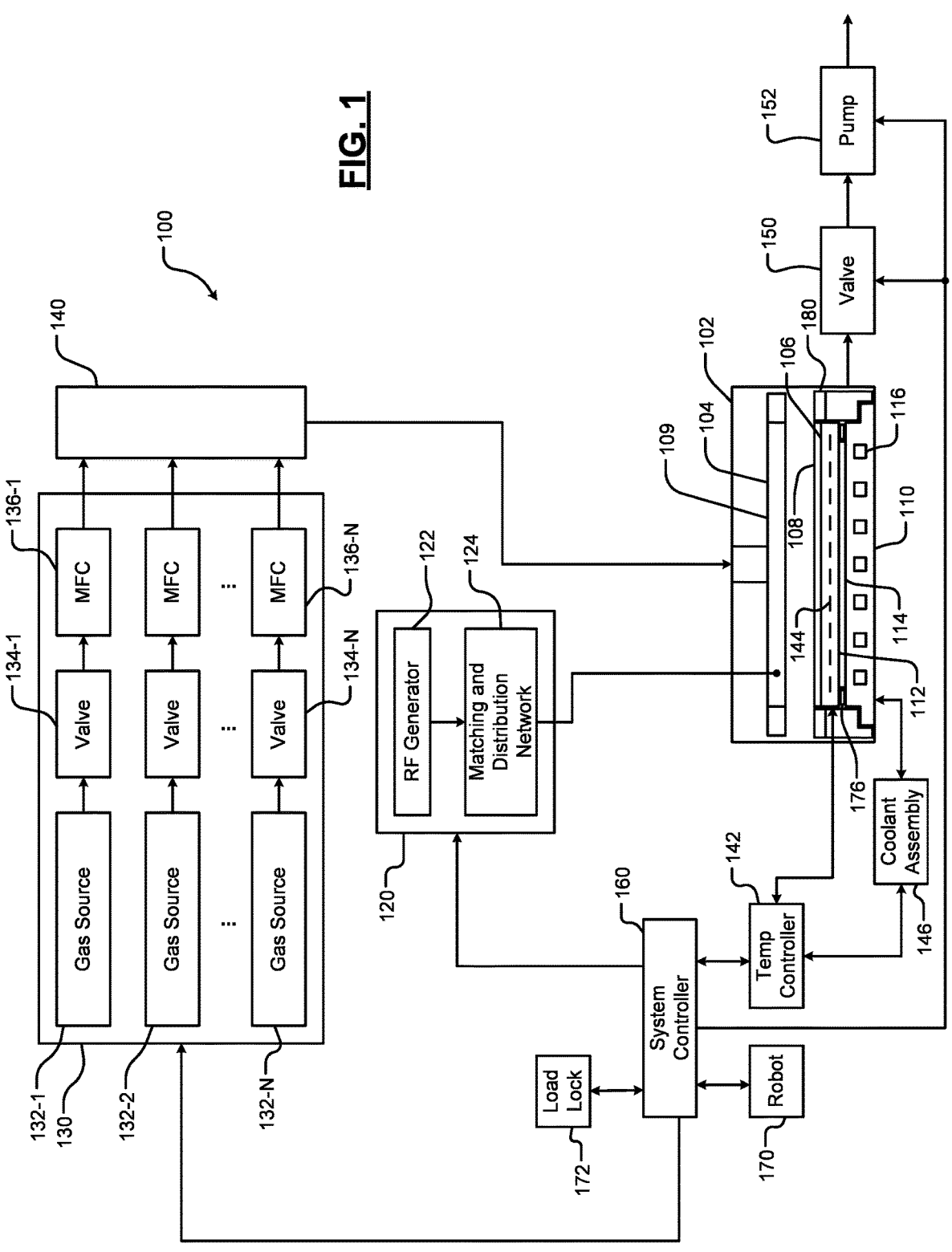
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases (e.g., etch process gases). The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more gases (e.g., etch gas, carrier gases, purge gases, etc.) and mixtures thereof. The gas sources may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may correspond to a top ring, which may be supported by a bottom ring 184. In some examples, the edge ring 180 may be further supported by one or more of a middle ring (not shown in FIG. 1), a stepped portion of the ceramic layer 112, etc. as described below in more detail. The edge ring 180 is moveable (e.g., moveable upward and downward in a vertical direction) relative to the substrate 108. For example, the edge ring 180 may be controlled via an actuator responsive to the controller 160. In some examples, the edge ring 180 may be adjusted during substrate processing (i.e., the edge ring 180 may be a tunable edge ring). In other examples, the edge ring 180 may be removable (e.g., using the robot 170, via an airlock, while the processing chamber 102 is under vacuum). In still other examples, the edge ring 180 may be both tunable and removable.

Figure 2A:
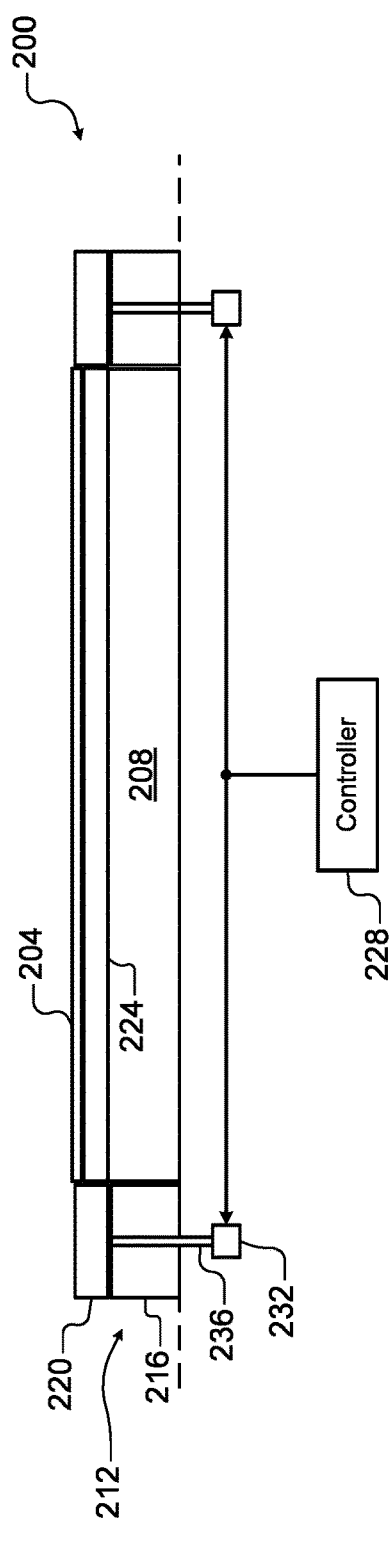
FIG. 2A shows an example moveable edge ring in a lowered position according to the present disclosure.
Figure 2B:
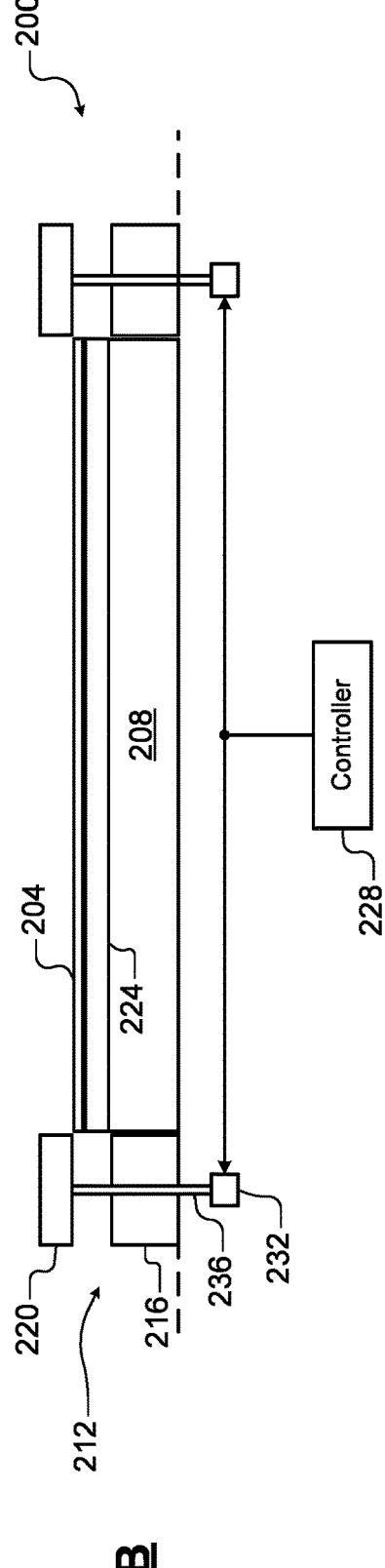
FIG. 2B shows an example moveable edge ring in a raised position according to the present disclosure.

Referring now to FIGS. 2A and 2B, an example substrate support 200 having a substrate 204 arranged thereon is shown. The substrate support 200 may include a base or pedestal having an inner portion (e.g., corresponding to an ESC) 208 and an outer portion 212. In examples, the outer portion 212 may be independent from, and moveable in relation to, the inner portion 208. For example, the outer portion 212 may include a bottom ring 216 and a top edge ring 220. The substrate 204 is arranged on the inner portion 208 (e.g., on a ceramic layer 224) for processing. A controller 228 communicates with one or more actuators 232 to selectively raise and lower the edge ring 220. For example, the edge ring 220 may be raised and/or lowered to adjust a pocket depth of the support 200 during processing. In another example, the edge ring 220 may be raised to facilitate removal and replacement of the edge ring 220.

For example only, the edge ring 220 is shown in a fully lowered position in FIG. 2A and in a fully raised position in FIG. 2B. As shown, the actuators 232 correspond to pin actuators configured to selectively extend and retract pins 236 in a vertical direction. Other suitable types of actuators may be used in other examples. For example only, the edge ring 220 corresponds to a ceramic or quartz edge ring, although other suitable materials may be used (e.g., silicon carbide, yttria, etc.). In FIG. 2A, the controller 228 communicates with the actuators 232 to directly raise and lower the edge ring 220 via the pins 236. In some examples, the inner portion 208 is moveable relative to the outer portion 212.

Figures 3A, 3B:
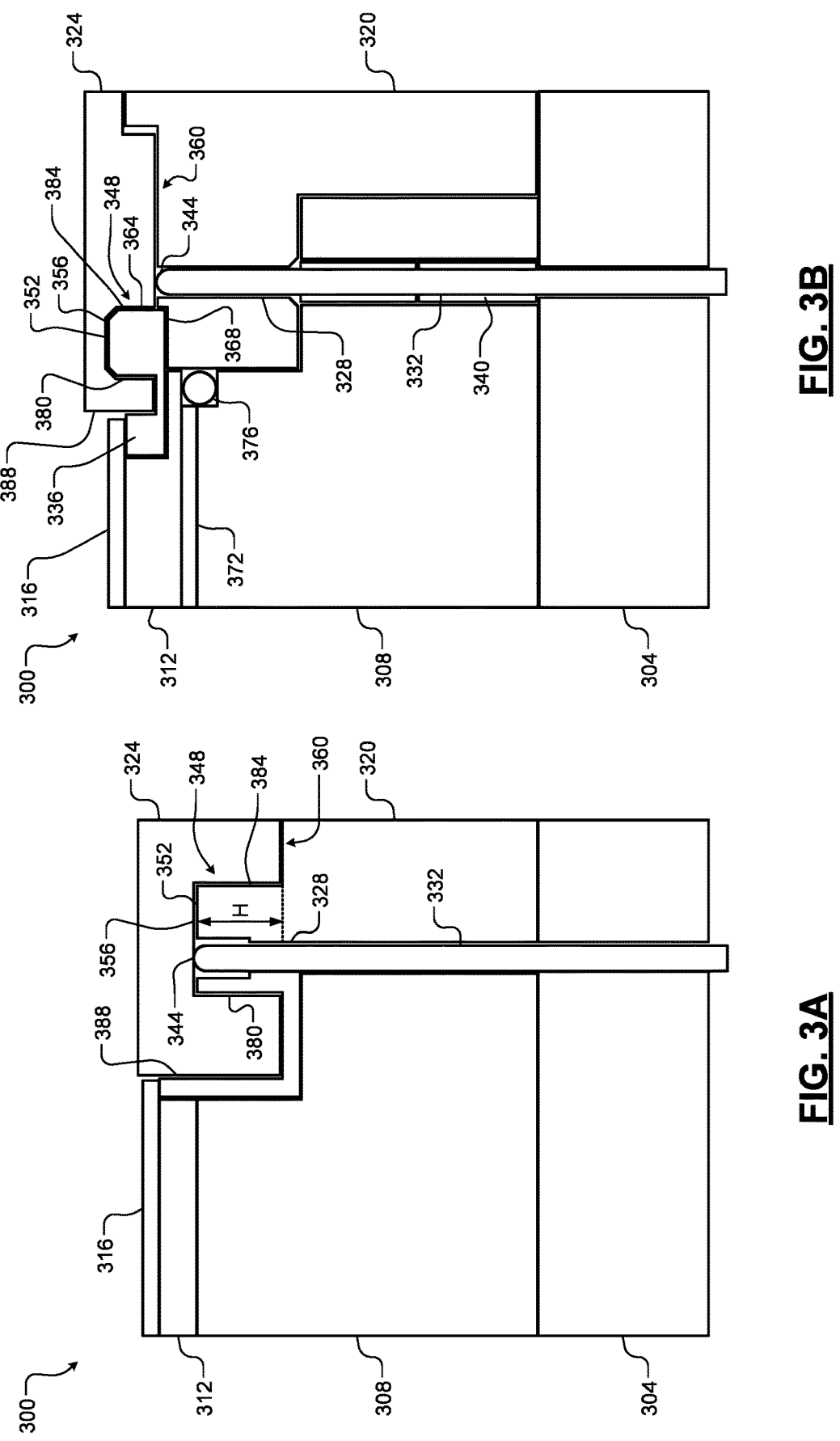
FIG. 3A shows a first example substrate support including a moveable edge ring according to the present disclosure.
FIG. 3B shows a second example substrate support including a moveable edge ring according to the present disclosure.

Features of an example substrate support 300 are shown in more detail in FIGS. 3A and 3B. The substrate support 300 includes an insulator ring or plate 304 and a baseplate (e.g., of an ESC) 308 arranged on the insulator plate 304. The baseplate 308 supports a ceramic layer 312 configured to support a substrate 316 arranged thereon for processing. In FIG. 3A, the ceramic layer 312 has a non-stepped configuration. In FIG. 3B, the ceramic layer 312 has a stepped configuration. The substrate support 300 includes a bottom ring 320 that supports an upper ("top") edge ring 324. One or more vias or guide channels 328 may be formed through the insulator plate 304, the bottom ring 320, and/or the baseplate 308 to accommodate respective lift pins 332 arranged to selectively raise and lower the edge ring 324. For example, the guide channels 328 function as pin alignment holes for respective ones of the lift pins 332. As shown in FIG. 3B, the substrate support 300 may further include a middle ring 336 arranged between the bottom ring 320 and the edge ring 324. In the stepped configuration, the middle ring 336 overlaps the ceramic layer 312 and is arranged to support an outer edge of the substrate 316.

The lift pins 332 may comprise an erosion-resistant material (e.g., sapphire). An outer surface of the lift pins 332 may be polished smooth to reduce friction between the lift pins 332 and structural features of the bottom ring 320 to facilitate movement. In some examples, one or more ceramic sleeves 340 may be arranged in the channels 328 around the lift pins 332. Each of the lift pins 332 may include a rounded upper end 344 to minimize contact area between the upper end 344 and the edge ring 324. The smooth outer surface, rounded upper end 344, guide channel 328, and/or ceramic sleeves 340 facilitate raising and lowering of the edge ring 324 and while preventing binding of the lift pins 332 during movement.

As shown in FIG. 3A, the bottom ring 320 includes a guide feature 348. In FIG. 3B, the middle ring 336 includes the guide feature 348. For example, the guide feature 348 corresponds to a raised annular rim 352 that extends upward from the bottom ring 320/the middle ring 336. In FIG. 3A, the guide channels 328 and the lift pins 332 extend through the guide feature 348 to engage the edge ring 324. Conversely, in FIG. 3B, the guide channels 328 and the lift pins 332 extend through the bottom ring 320 to engage the edge ring 324 without passing through the middle ring 336.

The edge ring 324 includes an annular bottom groove 356 arranged to receive the guide feature 348. For example, a profile (i.e., cross-section) shape of the edge ring 324 may generally correspond to a "U" shape configured to receive the guide feature 348, although other suitable shapes may be used. Further, although the upper surface of the edge ring 324 is shown as generally horizontal (i.e., parallel to an upper surface of the substrate support 300), the upper surface of the edge ring 324 may have a different profile in other examples. For example, the upper surface of the edge ring 324 may be tilted or slanted, rounded, etc. In some examples, the upper surface of the edge ring 324 is tilted such that a thickness at an inner diameter of the edge ring 324 is greater than a thickness at an outer diameter of the edge ring 324 to compensate for erosion at the inner diameter.

Accordingly, a bottom surface of the edge ring 324 is configured to be complementary to an upper surface of the bottom ring 320 in FIG. 3A, or respective surfaces of the bottom ring 320 and the middle ring 336 in FIG. 3B. Further, an interface 360 between the edge ring 324 and the bottom ring 320/middle ring 336 is labyrinthine. In other words, the lower surface of the edge ring 324 and, correspondingly, the interface 360, includes multiple changes of direction (e.g., 90 degree changes of direction, upward and downward steps, alternating horizontal and vertical orthogonal paths, etc.) rather than providing a direct (e.g., line of sight) path between the edge ring 324 and the bottom ring 320/middle ring 336 to interior structures of the substrate support 300. Typically, likelihood of plasma and process material leakage may be increased in substrate supports including multiple interfacing rings (e.g., both the top edge ring 324 and one or more of the middle ring 336 and the bottom ring 320). This likelihood may be further increased when the moveable edge ring 324 is raised during processing. Accordingly, the interface 360 (and, in particular, the profile of the edge ring 324) is configured to prevent process materials, plasma, etc. from reaching interior structures of the substrate support 300.

For example, as shown in FIG. 3A, the interface 360 includes five changes of direction to restrict access to the guide channels 328 and pins 332, the ceramic layer 312, a backside and edge of the substrate 316, etc. Conversely, as shown in FIG. 3B, the interface 360 includes seven changes of direction in a first path 364 and five changes of direction in a second path 368 to restrict access to the guide channels 328 and pins 332, the ceramic layer 312, a backside and edge of the substrate 316, a bond layer 372, a seal 376, etc. Accordingly, the interface 360 reduces the likelihood of plasma leakage and light-up, erosion, etc. affecting the interior structures of the substrate support 300.

The profile (i.e., cross-section) shape of the edge ring 324 (as well as the interfacing surfaces of the bottom ring 320, middle ring 336, etc.) is designed to facilitate manufacturing and reduce manufacturing costs. For example, walls 380, 384 of the groove 356 and the guide feature 340 may be substantially vertical (e.g., in contrast to being parabolic, trapezoidal, triangular, etc.) to facilitate manufacturing while preventing plasma and process material leakage. For example only, substantially vertical may be defined as being perpendicular to upper and/or lower surfaces of the edge ring 324, within 1° of a normal line of an upper and/or lower surface of the edge ring 324, parallel to a direction of movement of the edge ring 324, etc. Further, the vertical walls 380, 384 maintain alignment of the edge ring 324 relative to the guide feature 340 during movement of the edge ring 324. In contrast, when respective profiles of the groove 356 and the guide feature 340 are parabolic, trapezoidal, triangular, etc., upward movement of the edge ring 324 causes significant separation between the walls 380 and the walls 384.

Surfaces of the edge ring 324, the bottom ring 320, and the middle ring 336 within the interface 360 (and, in particular, within the groove 356) are relatively smooth and continuous to minimize friction between the edge ring 324 and the guide feature 340 during movement of the edge ring 324. For example, respective surfaces of the edge ring 324, the bottom ring 320, and the middle ring 336 within the interface 360 may undergo additional polishing to achieve a desired surface smoothness. In other examples, surfaces of the edge ring 324, the bottom ring 320, and the middle ring 336 within the interface 360 may be coated with a material that further reduces friction. In still other examples, the surfaces of the edge ring 324, the bottom ring 320, and the middle ring 336 within the interface 360 (and, in particular, the edge ring 324) may be free of screw holes and/or similar assembly features. In this manner, creation of particles due to contact between surfaces (e.g., during movement of the edge ring 324) may be minimized.

When the edge ring 324 is raised for tuning during processing as described above, the controller 228 as described in FIGS. 2A and 2B is configured to limit a tunable range of the edge ring 324 according to a height H of the guide feature 348. For example, the tunable range may be limited to less than the height H of the guide feature 348. For example, if the guide feature 348 has a height H of approximately 0.24" (e.g., 0.22"-0.26"), the tunable range of the edge ring 324 may be 0.25". In other words, the edge ring 324 may be raised from a fully lowered position (e.g., 0.0") to a fully raised position (e.g., 0.25") without entirely removing the guide feature 348 from the groove 356 in the edge ring 324. Accordingly, even in the fully raised position, the edge ring 324 still overlaps at least a portion of the guide feature 348. Limiting the range of the edge ring 324 in this manner retains the labyrinthine interface 360 as described above and prevents lateral misalignment of the edge ring 324. A depth of the groove 356 may be approximately equal to (e.g., within 5%) of the height H of the guide feature 348. The depth of the groove 356 may be at least 50% of the thickness of the edge ring. For example only, the tunable range of the edge ring 324 of FIG. 3A is 0.15" to 0.25" and the tunable range of the edge ring 324 of FIG. 3B is 0.05" to 0.15". For example, a thickness (i.e., height) of the edge ring 324 may be between approximately 0.50" (e.g., 0.45" to 0.55") and approximately 0.6" (e.g., 0.58" to 0.620"), and a depth of the groove 356 may be approximately 0.30" (e.g., 0.29" to 0.31").

For example, the "thickness" of the edge ring 324, as used herein, may refer to a thickness of the edge ring 324 at an inner diameter of the edge ring 324 (e.g., a thickness/height of the edge ring 324 at an inner wall 388). In some examples, a thickness of the edge ring 324 may not be uniform across an upper surface of the edge ring 324 (e.g., the upper surface of the edge ring 324 may be tilted as described above such that a thickness at the inner wall 388 is greater than a thickness at an outer diameter of the edge ring 324). However, since erosion due to exposure to plasma may be increased at the inner wall 388 relative to an outer diameter of the edge ring 324, the edge ring 324 may be formed such that the inner wall 388 has at least a predetermined thickness to compensate for the increased erosion at the inner wall 388. For example only, the inner wall 388 is substantially vertical to avoid contact with the substrate 316 during movement of the edge ring 324.

Figures 4A, 4B:
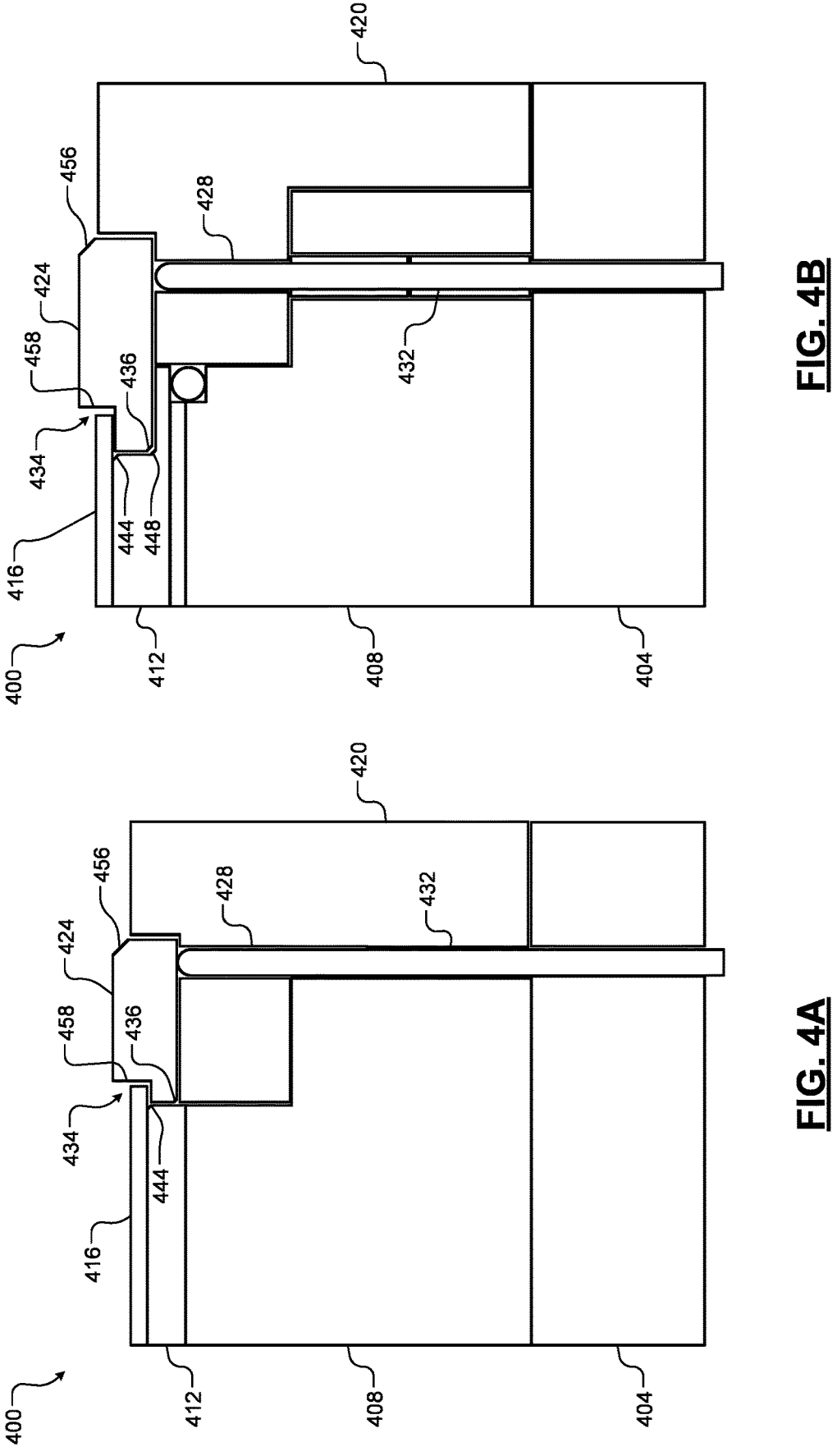
FIG. 4A shows a third example substrate support including a moveable edge ring according to the present disclosure.
FIG. 4B shows a fourth example substrate support including a moveable edge ring according to the present disclosure.
Figure 4C:
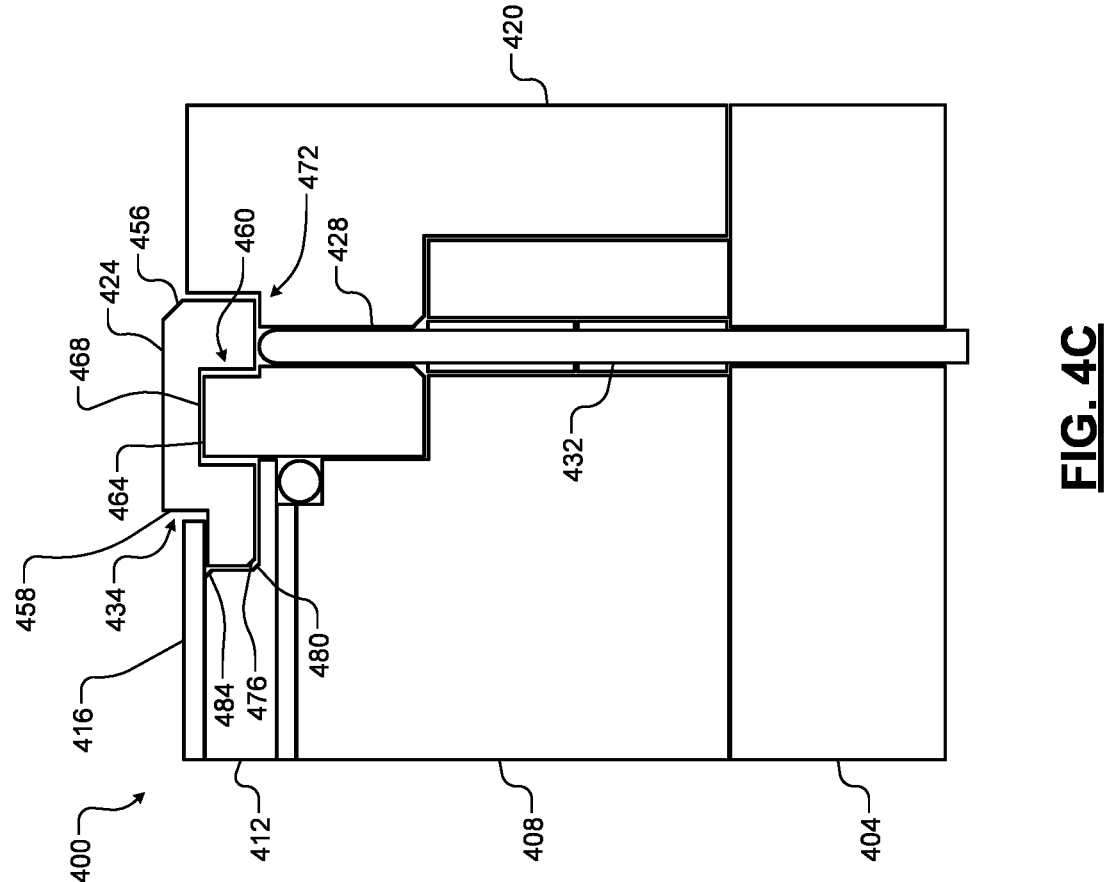
FIG. 4C shows a fifth example substrate support including a moveable edge ring according to the present disclosure.

Referring now to FIGS. 4A, 4B, and 4C, another example substrate support 400 is shown in more detail. The substrate support 400 includes an insulator ring or plate 404 and a baseplate 408 arranged on the insulator plate 404. The baseplate 408 supports a ceramic layer 412 configured to support a substrate 416 arranged thereon for processing. In FIG. 4A, the ceramic layer 412 has a non-stepped configuration. In FIGS. 4B and 4C, the ceramic layer 412 has a stepped configuration. The substrate support 400 includes a bottom ring 420 that supports an upper edge ring 424. In the stepped configuration, the edge ring 424 overlaps the ceramic layer 412. One or more vias or guide channels 428 may be formed through the insulator plate 404, the bottom ring 420, and/or the baseplate 408 to accommodate respective lift pins 432 arranged to selectively raise and lower the edge ring 424. For example, the guide channels 428 function as pin alignment holes for respective ones of the lift pins 432.

In the examples of FIGS. 4A, 4B, and 4C, the edge rings 424 are configured to support an outer edge of the substrate 416 arranged on the ceramic layer 412. For example, inner diameters of the edge rings 424 include a step 434 arranged to support the outer edge of the substrate 416. Accordingly, the edge ring 424 may be raised and lowered to facilitate removal and replacement of the edge ring 424 buy may not be raised and lowered during processing (i.e., the edge ring 424 is not tunable). For example, the edge ring 424 may be raised using the lift pins 432 for removal and replacement (e.g., using the robot 170).

In an example, a lower, inside corner 436 of the edge ring 424 may be chamfered to facilitate alignment (i.e., centering) of the edge ring 424 on the substrate support 400. Conversely, an upper, outside corner 444 and/or a lower, inside corner 448 of the ceramic layer 412 may be chamfered complementarily to the corner 436. Accordingly, as the edge ring 424 is lowered onto the substrate support 400, the chamfered corner 436 interacts with the chamfered corner(s) 444/448 to cause the edge ring 424 to self-center on the substrate support 400.

An upper, outer corner 456 of the edge ring 424 may be chamfered to facilitate removal of the edge ring 424 from the processing chamber 102. For example, since the substrate support 400 is configured for in situ removal of the edge ring 424 (i.e., without fully opening and venting the processing chamber 102), the edge ring 424 is configured to be removed via an airlock. Typically, airlocks are sized to accommodate substrates of a predetermined size (e.g., 300 mm). However, the edge ring 424 has a diameter that is significantly larger than the substrate 416 and a typical edge ring 424 may not fit through the airlock. Accordingly, a diameter of the edge ring 424 is reduced (e.g., as compared to the edge rings 324 as shown in FIGS. 3A and 3B). For example, an outer diameter of the edge ring 324 is similar to an outer diameter of the bottom ring 320. Conversely, an outer diameter of the edge ring 424 is significantly less than an outer diameter of the bottom ring 420. For example only, an outer diameter of the edge ring 424 is less than or equal to approximately 13"

(e.g., 12.5" to 13"). Chamfering the outer corner 456 further facilitates transfer of the edge ring 424 through the airlock.

For example only, the chamfer of the outer corner may have a height of 0.050" to 0.070", a width of 0.030" to 0.050", and an angle of 25-35°. In some examples, the chamfer of the lower corner 436 may have a height of approximately 0.025" (e.g., 0.015" to 0.040"), a width of approximately 0.015" (e.g., 0.005" to 0.030"), and an angle of approximately 60° (50-70°). For example only, a thickness (i.e., height) of the edge ring 424 is approximately, but not greater than, 0.275" (e.g., 0.25" to 0.30"). For example, the thickness of the edge ring 424 may not exceed a height of an airlock of the processing chamber 102 to allow removal of the edge ring 424. For example only, the "thickness" of the edge ring 424, as used herein, may refer to a thickness of the edge ring 424 at an inner diameter of the edge ring 424 (e.g., a thickness/height of the edge ring 424 at an inner wall 458) as described above with respect to FIGS. 3A and 3B.

As shown in FIG. 4C, the bottom ring 420 includes a guide feature 460. For example, the guide feature 460 corresponds to a raised annular rim 464 that extends upward from the bottom ring 420. The guide channels 428 and the lift pins 432 extend through the bottom ring 420 to engage the edge ring 424. The edge ring 424 includes an annular bottom groove 468 arranged to receive the guide feature 460. For example, a profile of the edge ring 424 may generally correspond to a "U" shape configured to receive the guide feature 460.

Accordingly, similar to the examples of FIGS. 3A and 3B, a bottom surface of the edge ring 424 in FIG. 4C is configured to be complementary to respective upper surfaces of the bottom ring 420 and the ceramic layer 412 to form a labyrinthine interface 472. In other words, the interface 472 includes multiple changes of direction (e.g., 90 degree changes of direction) rather than providing a direct path between the edge ring 424 and the bottom ring 420 to interior structures of the substrate support 400. In some examples, portions of the guide feature 460, the edge ring 424, the bottom ring 420, and/or the ceramic layer 412 within the interface 360 may be chamfered to facilitate alignment (i.e., centering) of the edge ring 424 on the substrate support 400. For example, a lower, inside corner 476 of an inner diameter of the edge ring 424 and a corresponding lower, inside corner 480 and/or upper, outside corner 484 of the ceramic layer 412 are chamfered. In other examples, mechanical alignment of the guide feature 460 within the groove 468 centers the edge ring 324. In some examples, the chamfer of the lower corner 476 may have a height of approximately 0.025" (e.g., 0.015" to 0.040"), a width of approximately 0.015" (e.g., 0.005" to 0.030"), and an angle of approximately 60° (e.g., 50-60°).

Figures 5A, 5B:
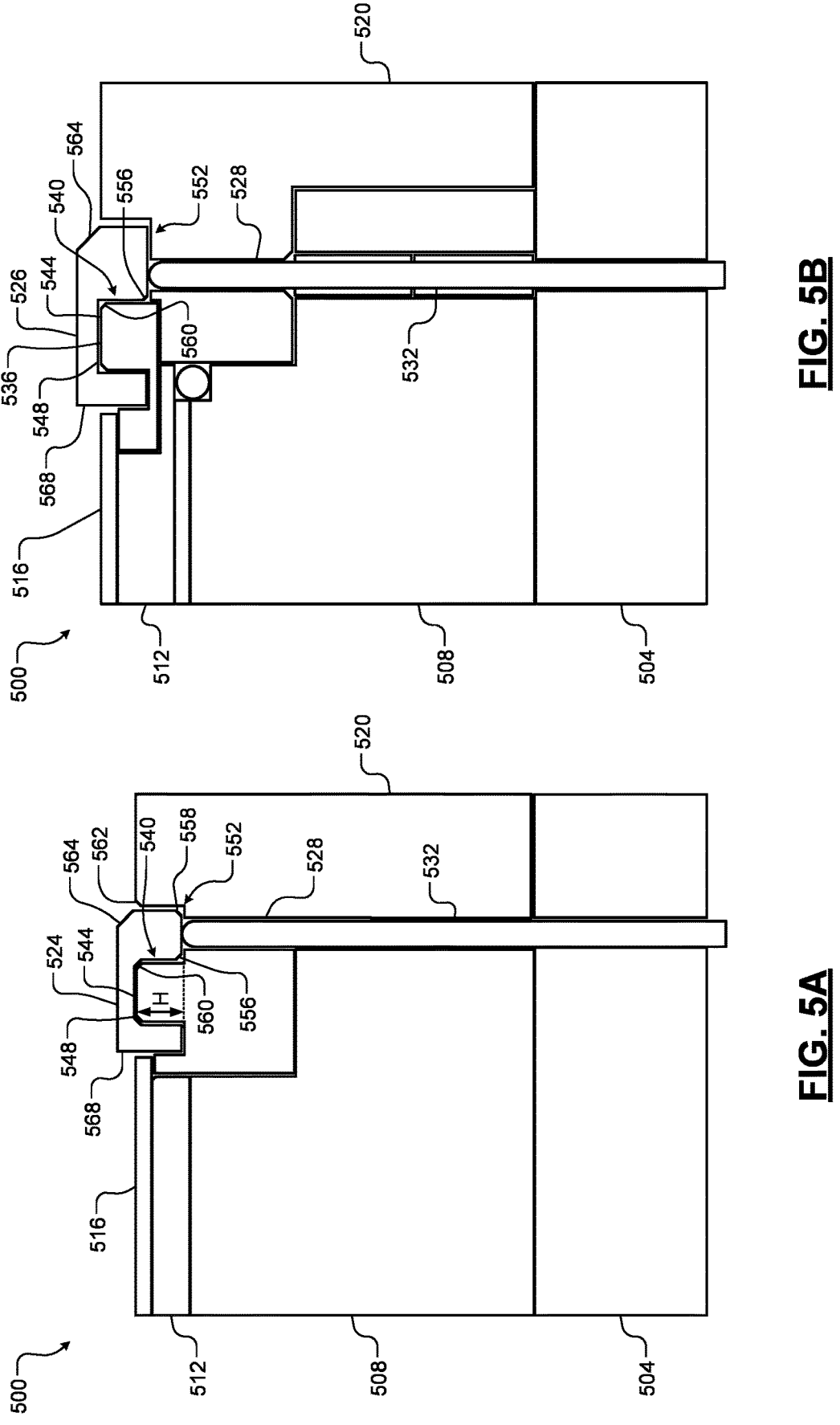
FIG. 5A shows a sixth example substrate support including a moveable edge ring according to the present disclosure.
FIG. 5B shows a seventh example substrate support including a moveable edge ring according to the present disclosure.

Referring now to FIGS. 5A and 5B, another example substrate support 500 is shown in more detail. The substrate support 500 includes an insulator ring or plate 504 and a baseplate 508 arranged on the insulator plate 504. The baseplate 508 supports a ceramic layer 512 configured to support a substrate 516 arranged thereon for processing. In FIG. 5A, the ceramic layer 512 has a non-stepped configuration. In FIG. 5B, the ceramic layer 512 has a stepped configuration. The substrate support 500 includes a bottom ring 520 that supports an upper edge ring 524 (as shown in FIG. 5A) or an upper edge ring 526 (as shown in FIG. 5B). One or more vias or guide channels 528 may be formed through the insulator plate 504, the bottom ring 520, and/or the baseplate 508 to accommodate respective lift pins 532 arranged to selectively raise and lower the edge ring 524/

526. For example, the guide channels 528 function as pin alignment holes for respective ones of the lift pins 532. As shown in FIG. 5B, the substrate support 500 may further include a middle ring 536 arranged between the bottom ring 520 and the edge ring 526. In the stepped configuration, the middle ring 536 overlaps the ceramic layer 512 and is arranged to support an outer edge of the substrate 516.

The examples of FIGS. 5A and 5B combine features of both the tunable edge rings 324 of FIGS. 3A and 3B and the removable/replaceable edge rings of FIGS. 4A, 4B, and 4C. For example, even in the stepped configuration of FIG. 5B, the edge ring 526 does not extend beneath and support the substrate 516. Accordingly, the edge ring 524/526 may be raised and lowered during processing. For example only, a tunable range of the edge ring 524 of FIG. 5A is 0.05" to 0.15" and a tunable range of the edge ring 526 of FIG. 5B is 0.02" to 0.05". Further, an outer diameter of the edge ring 524/526 is reduced as described with respect to FIGS. 4A, 4B, and 4C to facilitate transfer of the edge ring 524/526 through an airlock. Accordingly, the edge ring 524/526 may be removed and replaced in situ as described above.

As shown in FIG. 5A, the bottom ring 520 includes a guide feature 540. In FIG. 5B, the middle ring 536 includes the guide feature 540. For example, the guide feature 540 corresponds to a raised annular rim 544 that extends upward from the bottom ring 520/the middle ring 536. In each of FIGS. 5A and 5B, the guide channels 528 and the lift pins 532 extend through the bottom ring 520 to engage the edge ring 524/526. For example, the edge ring 524/526 includes an annular bottom groove 548 arranged to receive the guide feature 540. For example, a profile of the edge ring 524/526 may generally correspond to a "U" shape configured to receive the guide feature 540.

Accordingly, similar to the examples of FIGS. 3A, 3B, and 4C, a bottom surface of the edge ring 524/526 is configured to be complementary to respective upper surfaces of the bottom ring 520 and the middle ring 536 to form a labyrinthine interface 552. In other words, the interface 552 includes multiple changes of direction (e.g., 90 degree changes of direction) rather than providing a direct path between the edge ring 524/526 and the bottom ring 520 to interior structures of the substrate support 500. In some examples, portions of the guide feature 540, the edge ring 524/526, the bottom ring 520, and/or the middle ring 536 within the interface 552 may be chamfered to facilitate alignment (i.e., centering) of the edge ring 524/526 on the substrate support 500. For example, in FIG. 5A, corners 556 and 558 of the edge ring 524 and complementary corners 560 of the guide feature 540 and 562 of the bottom ring 520 are chamfered. Conversely, in FIG. 5B, only the corner 556 of the edge ring 526 and the corner 560 of the bottom ring 520 are chamfered. An upper, outer corner 564 of the edge ring 524 may be chamfered to facilitate removal of the edge ring 524 from the processing chamber 102 as described above with respect to FIGS. 4A, 4B, and 4C.

For example only, the chamfers of the lower corners 556 and 558 may have a height and width of approximately 0.005" to 0.030" and an angle of approximately 25 to 35°. For example, a thickness (i.e., height) of the edge ring 524/526 may be approximately, but not greater than, 0.25" (e.g., 0.25" to 0.26") and a depth of the groove 548 may be 0.200" to 0.220". A difference between the thickness of the edge ring 524/526 and the depth of the groove 548 may be not less than 0.075". For example, the thickness of the edge ring 524/526 may not exceed a height of an airlock of the processing chamber 102 to allow removal of the edge ring 524/526. However, the thickness of the edge ring 524/526 may also be maximized, without exceeding the height of the airlock, to optimize tunability of the edge ring 524/526. In other words, as the edge ring 524/526 erodes over time, the amount the edge ring 524/526 may be raised without needing to be replaced increases proportionately to the thickness of the edge ring 524/526. For example only, the "thickness" of the edge ring 524/526 as used herein, may refer to a thickness of the edge ring 524/526 at an inner diameter of the edge ring 524/526 (e.g., a thickness/height of the edge ring 524/526 at an inner wall 568) as described above with respect to FIGS. 3A, 3B, 4A, 4B, and 4C.

Figures 6A, 6B:
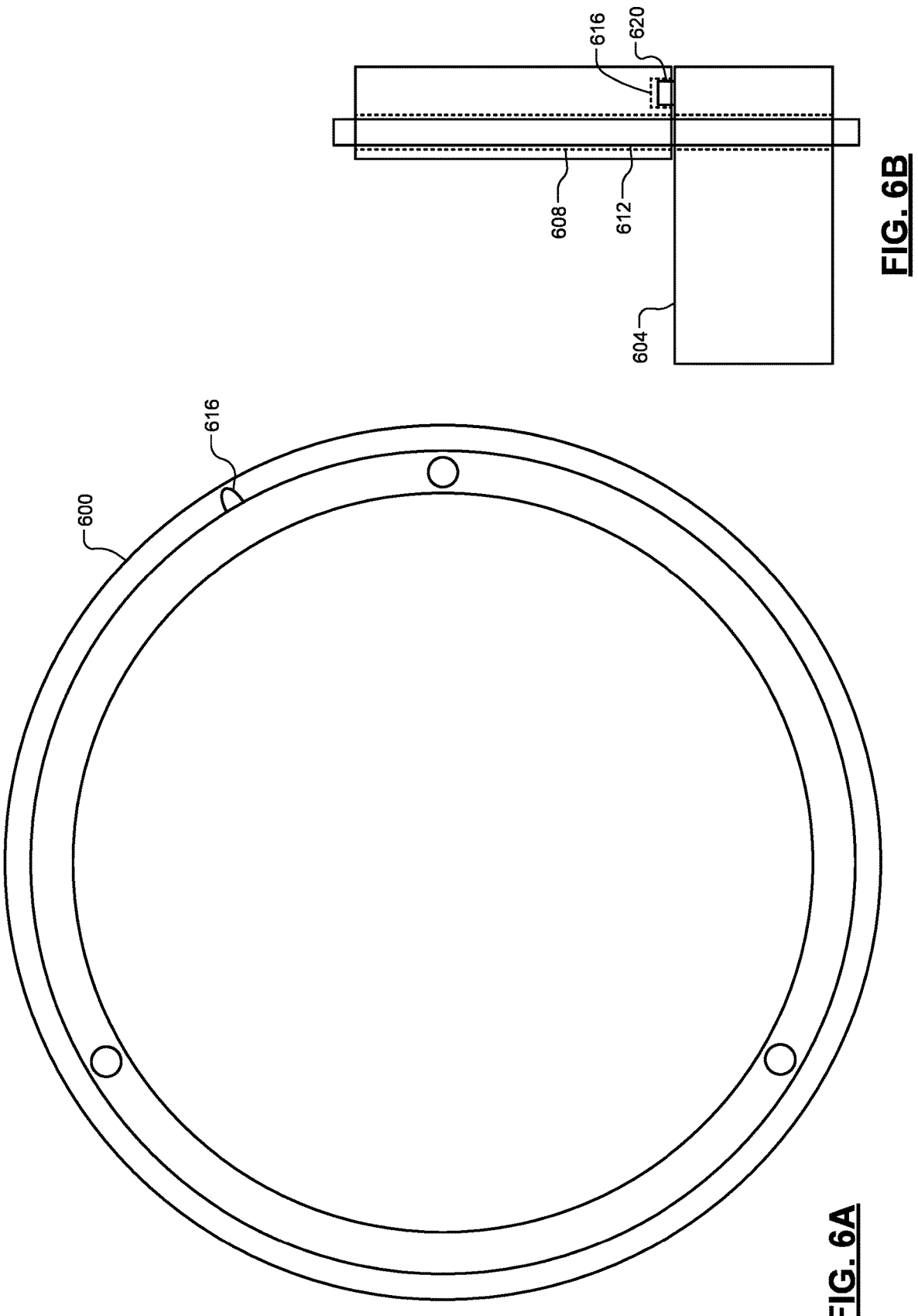
FIG. 6A shows a bottom view of an example bottom ring of a substrate support according to the present disclosure.
FIG. 6B shows a clocking feature of a bottom ring of a substrate support according to the present disclosure.

Referring now to FIGS. 6A and 6B, an example bottom ring 600 (e.g., corresponding to any of the bottom rings 320, 420, or 520) may implement a clocking feature to facilitate alignment of the bottom ring 600 with an insulator ring 604. The bottom ring 600 includes a plurality of guide channels 608 arranged to receive respective lift pins 612 extending through the insulator ring 604. The bottom ring 600 further includes one or more clocking features, such as a notch 616. The notch 616 is configured to receive a complementary structure, such as a projection 620, extending upward from the insulator ring 604. Accordingly, the bottom ring 600 may be installed such that the notch 616 is aligned with and receives the projection 620 to ensure that the guide channels 608 are aligned with respective ones of the lift pins 612.

Figures 7A, 7B:
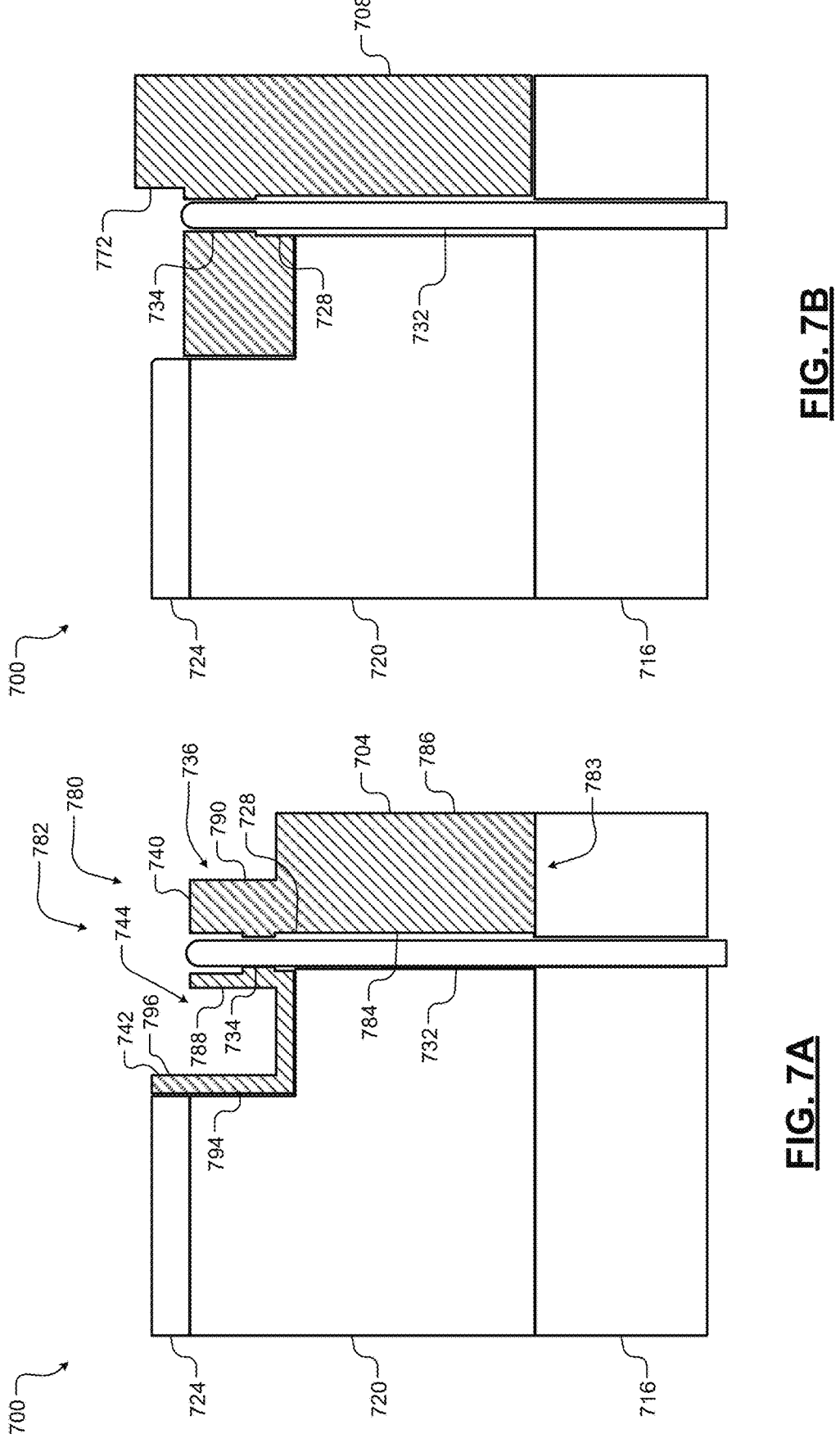
FIG. 7A shows a first example of a bottom ring configured to support a moveable edge ring according to the present disclosure.
FIG. 7B shows a second example of a bottom ring configured to support a moveable edge ring according to the present disclosure.
Figures 7C, 8A:
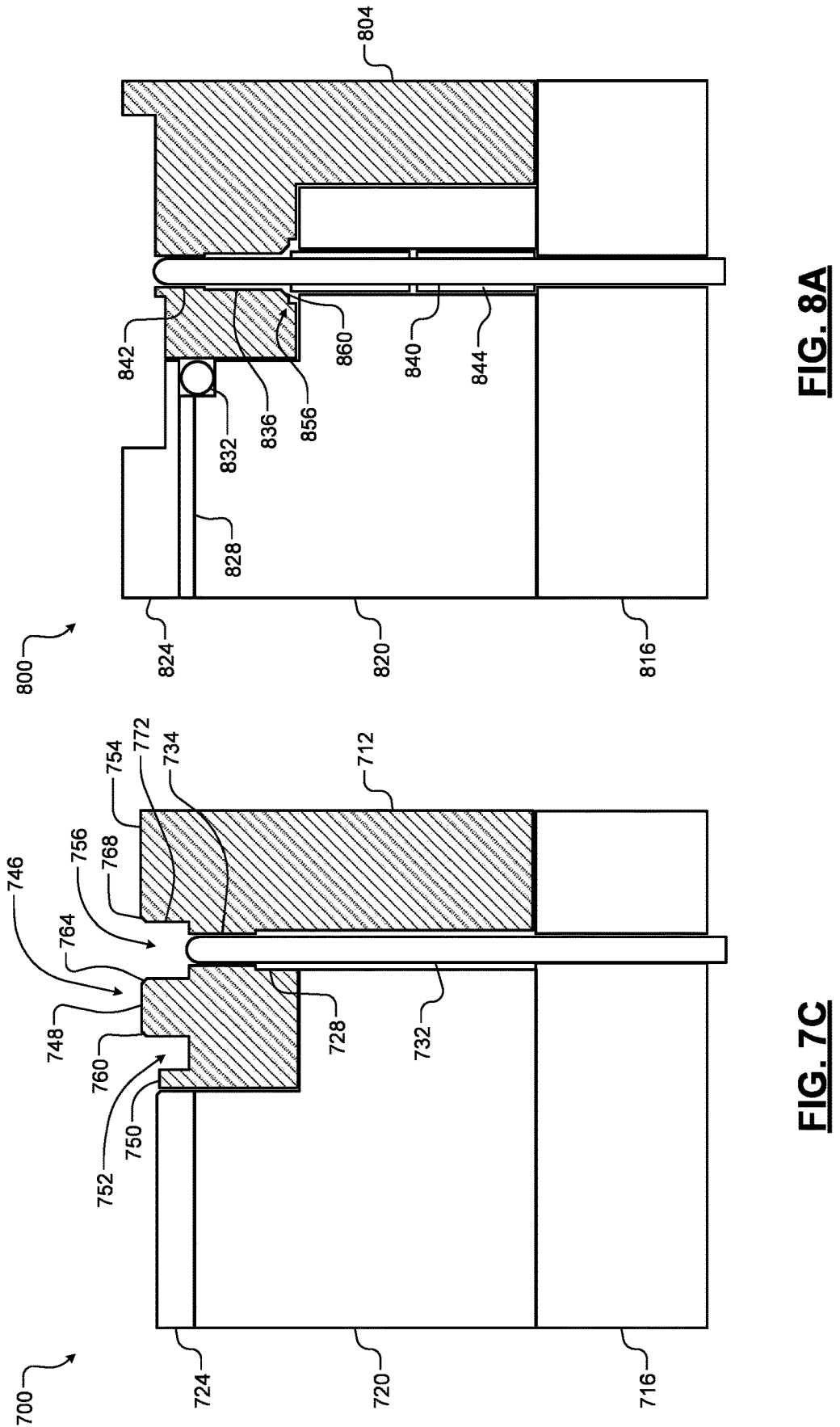
FIG. 7C shows a third example of a bottom ring configured to support a moveable edge ring according to the present disclosure.
FIG. 8A shows a fourth example of a bottom ring configured to support a moveable edge ring according to the present disclosure.

Referring now to FIGS. 7A, 7B, and 7C, a substrate support 700 includes example bottom rings 704, 708, and 712 configured to support top moveable edge rings in a non-stepped configuration according to the principles of the present disclosure. For example, as shown in FIG. 7A, the bottom ring 704 is configured to support the edge ring 324 of FIG. 3A. As shown in FIG. 7B, the bottom ring 708 is configured to support the edge ring 424 of FIG. 4A. As shown in FIG. 7C, the bottom ring 712 is configured to support the edge ring 524 of FIG. 5A. Respective upper surfaces of each of the bottom rings 704, 708, and 712 is stepped. In other words, each of the respective upper surfaces has at least two different heights.

The substrate support 700 includes an insulator ring or plate 716 and a baseplate (e.g., of an ESC) 720 arranged on the insulator plate 716. The baseplate 720 supports a ceramic layer 724 configured to support a substrate thereon for processing. One or more vias or guide channels 728 may be formed through the insulator plate 716 and the bottom rings 704, 708, 712 to accommodate lift pins 732 arranged to selectively raise and lower the respective edge rings. For example, the guide channels 728 function as pin alignment holes for respective ones of the lift pins 732. A gap between the lift pins 732 and inner surfaces of the guide channels 728 is minimized to decrease plasma leakage. In other words, a diameter of the guide channels 728 is only slightly greater (e.g., 0.005"-0.010" greater) than a diameter of the lift pins 732. For example, the lift pins 732 may have a diameter of 0.057"-0.061" while the guide channels 728 have a diameter of 0.063"-0.067". In some examples, the guide channels 728 include narrow regions 734 that have a diameter that is less than other portions of the guide channels 728 to further restrict plasma leakage. For example, the narrow regions 734 may have a diameter that is 0.002-0.004" less than the diameter of the guide channels 728. Similarly, in some examples, the lift pins 732 may include narrow regions located within the narrow regions 734 of the guide channels 728.

As shown in FIG. 7A, the bottom ring 704 includes a guide feature 736. For example, the guide feature 736 corresponds to a raised annular rim 740 that extends upward from the bottom ring 704. The rim 740 and an inner annular rim 742 define a groove 744. The guide channels 728 and the lift pins 732 extend through the guide feature 736. An upper surface of the bottom ring 704 is configured to be complementary to a bottom surface of the edge ring 324 to form a labyrinthine interface including multiple changes of direction as described above. Respective widths of the groove 744 and the rim 740 are selected to minimize gaps between respective vertical surfaces of the groove 744 and the rim 740 and complementary vertical surfaces on the bottom of the edge ring 324. For example, the gaps may be less than 0.02". The bottom ring 704 includes an annular body 780 defining an upper surface 782, a lower surface 783, a lower annular inner diameter 784, and a lower annular outer diameter 786. The rim 740 (raised annular rim) extends upwardly along the upper surface 782. The rim 740 includes an inner annular diameter 788 located radially inwardly from the lower annular inner diameter 784 and an outer annular diameter 790 located radially inwardly from the lower annular outer diameter 786. The inner annular rim 742 includes a radially inner diameter 794 and a radially outer diameter 796.

Similarly, as shown in FIG. 7C, the bottom ring 712 includes a guide feature 746. For example, the guide feature 746 corresponds to a raised annular rim 748 that extends upward from the bottom ring 712. The rim 748 and an inner annular rim 750 define a first groove 752 while the rim 748 and an outer annular rim 754 define a second groove 756. The guide channels 728 and the lift pins 732 extend through the bottom ring 712. An upper surface of the bottom ring 712 is configured to be complementary to a bottom surface of the edge ring 524 to form a labyrinthine interface including multiple changes of direction as described above. A height of the rim 748 is greater than a height of the inner annular rim 750 to facilitate engagement of the rim 748 with the edge ring 524 prior to contact between the inner annular rim 750 and the edge ring 524.

In some examples, portions of the guide feature 746 and/or the bottom ring 712 may be chamfered to facilitate alignment (i.e., centering) of the edge ring 524 on the substrate support 700. For example, corners 760 and 764 of the guide feature 746 and corner 768 of the bottom ring 712 are chamfered. In some examples, the chamfer of the corner 760 may have a height and width of at least approximately 0.008" (e.g., 0.007" to 0.011") and an angle of 15-25°. The chamfer of the corner 764 may have a height and width of at least approximately 0.01" (e.g., 0.01" to 0.02") and an angle of 20-35°. The chamfer of the corner 768 may have a height and width of at least approximately 0.010" (e.g., 0.010" to 0.030") and an angle of 20-35°.

Inner diameters of the bottom rings 704, 708, and 712 may be at least 11.5" (e.g., between 11.5" and 11.7"). Outer diameters of the bottom rings 704, 708, and 712 may be no greater than 14" (e.g., between 13.8" and 14.1"). Step inner diameters of the bottom rings 708 and 712 at 772 are selected to accommodate the outer diameter of the edge ring 424 or 524. For example, the outer diameter of the edge ring 424 or 524 may be approximately 12.8" (e.g., +/−0.10"). Accordingly, the inner diameter of the bottom rings 708 and 712 at 772 may be at least 13.0".

Figures 8B, 8C, 9:
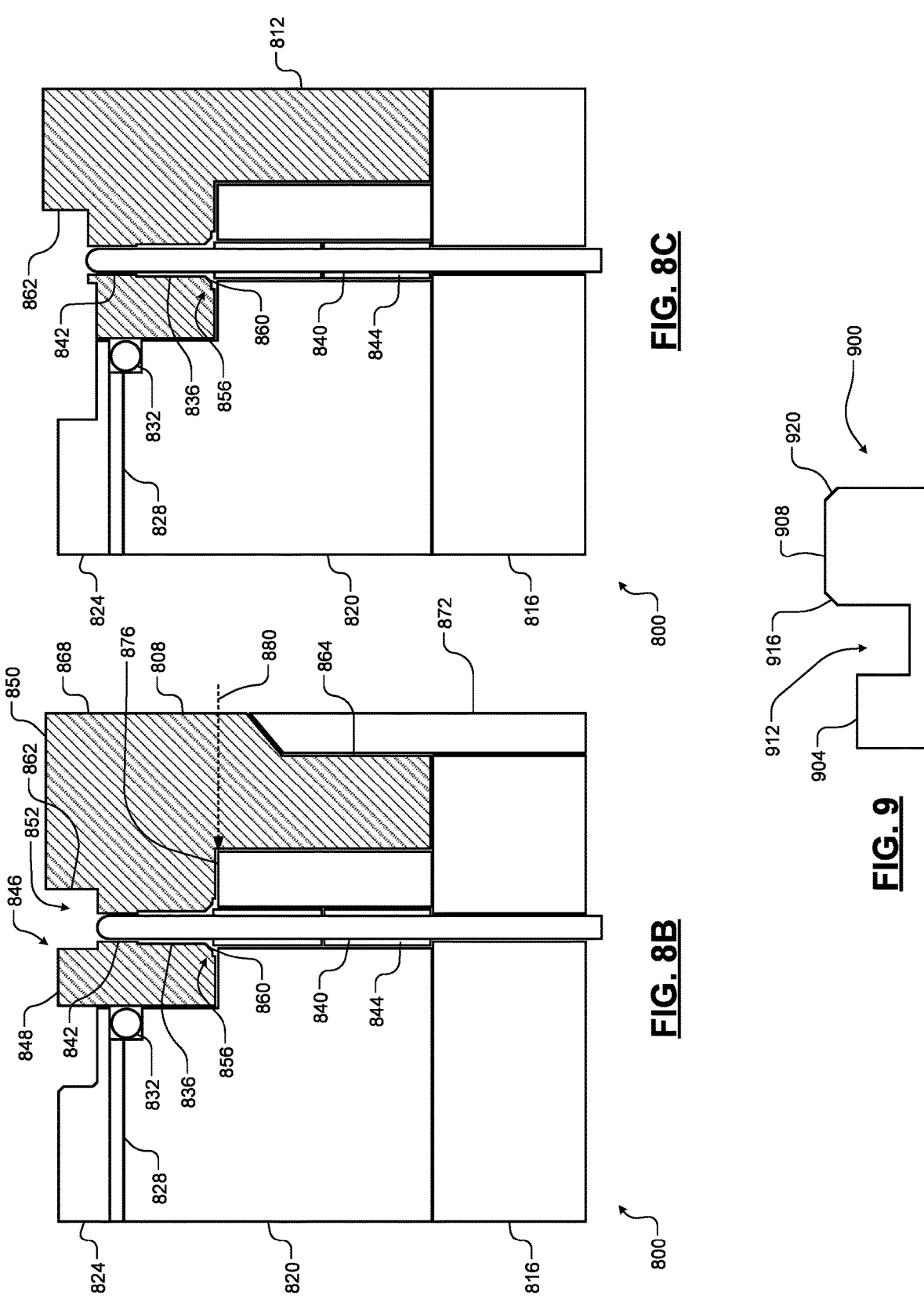
FIG. 8B shows a fifth example of a bottom ring configured to support a moveable edge ring according to the present disclosure.
FIG. 8C shows a sixth example of a bottom ring configured to support a moveable edge ring according to the present disclosure.
FIG. 9 shows a middle ring configured to support a moveable edge ring according to the present disclosure.

Referring now to FIGS. 8A, 8B, and 8C, a substrate support 800 includes example bottom rings 804, 808, and 812 configured to support top moveable edge rings in a stepped configuration according to the principles of the present disclosure. For example, as shown in FIG. 8A, the bottom ring 804 is configured to support the edge ring 324 of FIG. 3B. As shown in FIG. 8B, the bottom ring 808 is configured to support the edge ring 424 of FIG. 4C. As shown in FIG. 8C, the bottom ring 812 is configured to support the edge ring 526 of FIG. 5B. The bottom rings 804 and 812 may be further configured to support the middle ring 336 of FIG. 3B and the middle ring 536 of FIG. 5B, respectively. Respective upper surfaces of each of the bottom rings 804, 808, and 812 is stepped. In other words, each of the respective upper surfaces has at least two different heights.

The substrate support 800 includes an insulator ring or plate 816 and a baseplate (e.g., of an ESC) 820 arranged on the insulator plate 816. The baseplate 820 supports a ceramic layer 824 configured to support a substrate thereon for processing. A bond layer 828 may be arranged between the baseplate 820 and the ceramic layer 824 and a seal 832 surrounds the bond layer 828. One or more vias or guide channels 836 may be formed through the insulator plate 816 and the bottom rings 804, 808, and 812 to accommodate lift pins 840 arranged to selectively raise and lower the respective edge rings. For example, the guide channels 836 function as pin alignment holes for respective ones of the lift pins 840. A gap between the lift pins 840 and inner surfaces of the guide channels 836 is minimized to decrease plasma leakage. In other words, a diameter of the guide channels 836 is only slightly greater (e.g., 0.005"-0.010" greater) than a diameter of the lift pins 840. For example, the lift pins 840 may have a diameter of 0.1" while the guide channels 836 have a diameter of 0.105". In some examples, the guide channels 836 include narrow regions 842 that have a diameter that is less than other portions of the guide channels 836 to further restrict plasma leakage. For example, the narrow regions 842 may have a diameter that is 0.002-0.004" less than the diameter of the guide channels 836. In some examples, one or more ceramic sleeves 844 may be arranged in the channels 836 around the lift pins 840.

As shown in FIG. 8B, the bottom ring 808 includes a guide feature 846. For example, the guide feature 846 corresponds to a raised annular rim 848 that extends upward from the bottom ring 808. The rim 848 and an outer annular rim 850 define a groove 852. An upper surface of the bottom ring 808 is configured to be complementary to a bottom surface of the edge ring 424 to form a labyrinthine interface including multiple changes of direction as described above. Respective widths of the groove 852 and the rim 848 are selected to minimize gaps between respective vertical surfaces of the groove 852 and the rim 848 and complementary vertical surfaces on the bottom of the edge ring 424. For example, the gaps may be less than 0.010". Conversely, in FIGS. 8A and 8C, the bottom rings 804 and 812 are configured to support the middle rings 336 and 536 having respective guide features 348 and 540. Accordingly, upper surfaces of the bottom rings 804 and 812 are configured to be, in combination with upper surfaces of the middle rings 336 and 536, complementary to bottom surfaces of the edge rings 324 and 526 to form a labyrinthine interface including multiple changes of direction as described above.

In examples where the guide channels 836 include the ceramic sleeves 844 (e.g., examples where the guide channels 836 are routed through the baseplate 820), the bottom rings 804, 808, and 812 may be configured to accommodate the ceramic sleeves 844. For example, the bottom rings 804, 808, and 812 may include a clearance feature such as cavity or cutout 856 having a greater diameter than the guide channels 836 to accommodate upper ends of the ceramic sleeves 844. In some examples, the bottom rings 804, 808, and 812 may be installed subsequent to the lift pins 840. Accordingly, respective openings in the bottom rings 804, 808, and 812 may include a chamfered edge 860 to facilitate installation of the bottom rings 804, 808, and 812 over the lift pins 840. For example, the chamfer of the edge 860 may have a height and width of 0.020" to 0.035" and an angle of 40-50°.

As shown in FIGS. 8B and 8C, step inner diameters of the bottom rings 808 and 812 at 862 are selected to accommodate the outer diameter of the edge rings 424 of FIG. 4C and 526 of FIG. 5B. For example, the outer diameter of the edge rings 424 and 526 may be approximately 12.8" (e.g., +/−0.10"). Accordingly, the inner diameters of the bottom rings 808 and 812 at 862 may be at least 13.0". Accordingly, a gap between the bottom rings 808 and 812 and the outer diameter of the edge rings 424 and 526 can be minimized while still preventing contact between vertical surfaces of the bottom rings 808 and 812 and the edge rings 424 and 526.

In some examples, such as shown in FIG. 8B, the bottom ring 808 may include a first outer diameter at 864 and a second outer diameter at 868. The second outer diameter 868 is greater than the first outer diameter at 864. For example, the substrate support 800 may include a liner 872 that protects outer portions of the insulator plate 816, the baseplate 820, the bottom ring 808, etc. However, the liner 872 may not protect upper portions of the bottom ring 808 that are exposed to plasma, and increased erosion of the bottom ring 808 in a region adjacent to an upper edge 876 of the baseplate 820 (as indicated by dashed arrow 880) may occur. Accordingly, the bottom ring 808 includes additional material at the second outer diameter 868 to compensate for the increased erosion.

Referring now to FIG. 9, an example middle ring 900 is shown. The middle ring 900 may be provided in configurations where the top edge ring would otherwise be supported by upper surfaces of two different components of a substrate support. For example, as shown in FIGS. 3B and 5B (corresponding to FIGS. 8A and 8C, respectively), the top edge rings overlap both a respective ceramic layer and a respective bottom ring. Accordingly, the middle ring 900 is arranged to support a portion of the top edge ring that would otherwise by supported by the ceramic layer. As shown, the middle ring 900 is "U"-shaped.

The middle ring 900 includes an inner annular rim 904 and an outer annular rim 908 defining a groove 912. The groove 912 is configured to receive a respective top edge ring (e.g., the edge ring 324 or 526). Conversely, the outer annular rim 908 functions as a guide feature to center the top edge ring 324 or 526 during replacement as described above in FIGS. 3B and 5B. In some examples, corners 916 and 920 are chamfered to facilitate engagement with the top edge ring. For example, the chamfer of the corner 916 may have a height and width of at least approximately 0.010" (e.g., 0.005" to 0.015") and an angle of approximately 20° (e.g., 15-25°). The chamfer of the corner 920 may have a height and width of at least approximately 0.015" (e.g., 0.010" to 0.020") and an angle of approximately 30° (e.g., 25-35°). A width of the outer annular rim 908 is selected to minimize gaps between respective vertical surfaces of the rim 908 and complementary vertical surfaces on the bottom of the edge ring 324 or 526. For example, the gaps may be less than 0.010" to restrict plasma leakage.

Figures 10A, 10B:
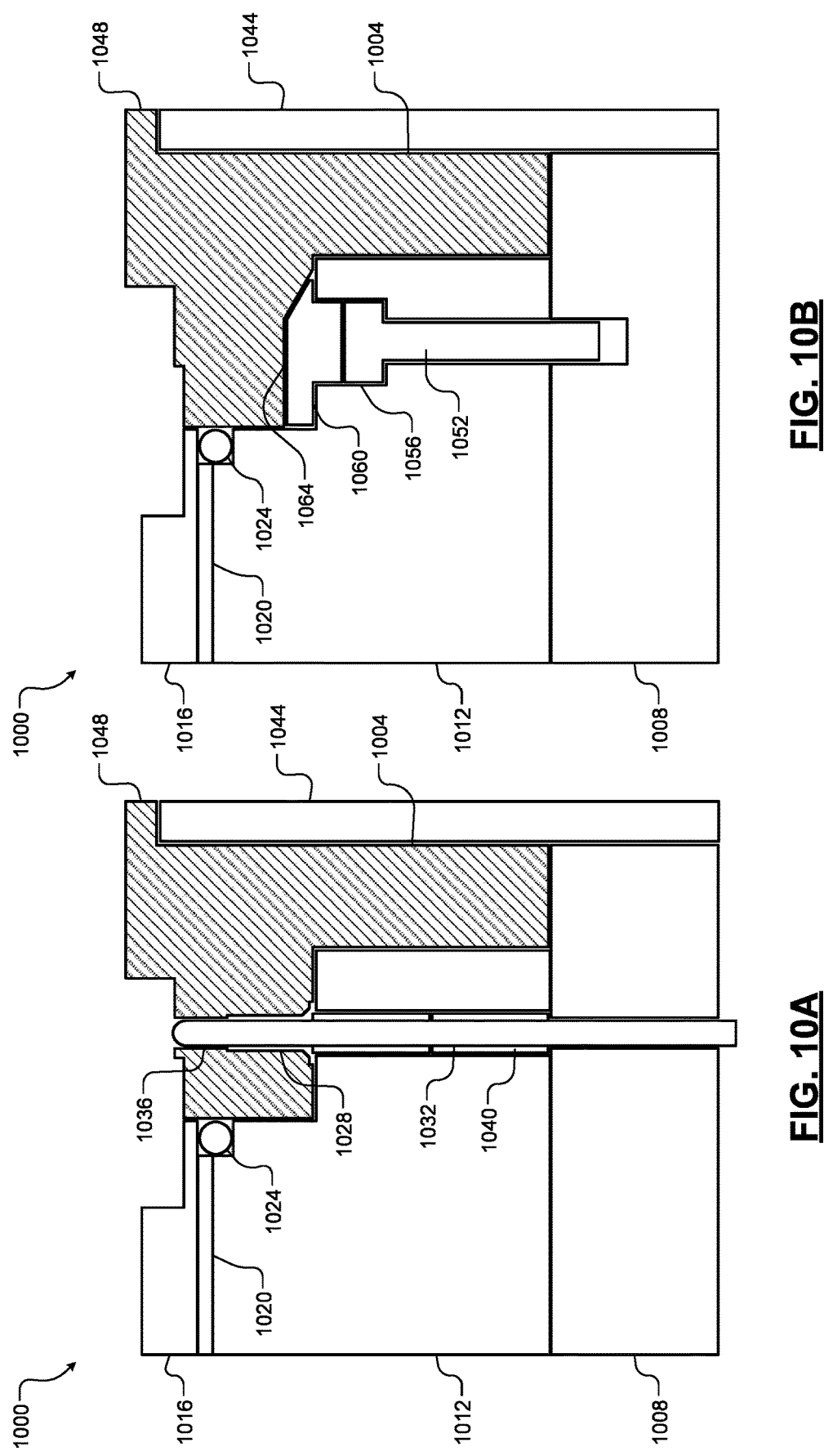
FIGS. 10A and 10B show a seventh example of a bottom ring configured to support a moveable edge ring according to the present disclosure.

Referring now to FIGS. 10A and 10B, two cross-sectional views of a substrate support 1000 illustrate a bottom ring 1004 configured to support top moveable edge rings in a stepped configuration according to the principles of the present disclosure. For example, the bottom ring 1004 is configured to support an edge ring (e.g., 526) in a configuration similar to that shown in FIGS. 5B and 8C. The bottom ring 1004 may be further configured to support a middle ring in a configuration similar to that shown in FIG. 5B.

The substrate support 1000 includes an insulator ring or plate 1008 and a baseplate (e.g., of an ESC) 1012 arranged on the insulator plate 1008. The baseplate 1012 supports a ceramic layer 1016 configured to support a substrate thereon for processing. A bond layer 1020 may be arranged between the baseplate 1012 and the ceramic layer 1016 and a seal 1024 surrounds the bond layer 1020. As shown in FIG. 10A, one or more vias or guide channels 1028 may be formed through the insulator plate 1008, the baseplate 1012, and the bottom ring 1004 to accommodate lift pins 1032 arranged to selectively raise and lower the edge ring. For example, the guide channels 1028 function as pin alignment holes for respective ones of the lift pins 1032. A gap between the lift pins 1032 and inner surfaces of the guide channels 1028 is minimized to decrease plasma leakage. In other words, a diameter of the guide channels 1028 is only slightly greater (e.g., 0.005"-0.010" greater) than a diameter of the lift pins 1032. For example, the lift pins 1032 may have a diameter of 0.1" while the guide channels 1028 have a diameter of 0.105". In some examples, the guide channels 1028 include narrow regions 1036 that have a diameter that is less than other portions of the guide channels 1028 to further restrict plasma leakage. For example, the narrow regions 1036 may have a diameter that is 0.002-0.004" less than the diameter of the guide channels 1028. In some examples, one or more ceramic sleeves 1040 may be arranged in the channels 1028 around the lift pins 1032.

The substrate support 1000 may include a liner 1044 arranged to enclose and protect components of the substrate support 1000 such as the insulator plate 1008, the baseplate 1012, and the bottom ring 1004. The bottom ring 1004 as shown in FIGS. 10A and 10B includes an annular lip 1048 extending radially outward from the bottom ring 1004 above the liner 1044. The lip 1048 facilitates installation and removal of the bottom ring 1004 when the liner 1044 is present.

As shown in FIG. 10B, the baseplate 1012 may be coupled to the insulator plate 1008 using bolts 1052 inserted through respective bolt mounting holes 1056. Ceramic plugs 1060 are arranged above the bolts 1052 to prevent plasma leakage in the bolt mounting holes 1056 and between the bottom ring 1004 and the baseplate 1012. The bottom ring 1004 as shown in FIG. 10B includes clearance features such as cavities or cutouts 1064 to accommodate the ceramic plugs 1060.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A bottom ring configured to support a moveable edge ring, wherein the moveable edge ring is configured to be raised and lowered relative to a substrate support, the bottom ring comprising:

an annular body defining an upper surface, a lower surface, a lower annular inner diameter, and a lower annular outer diameter;

a plurality of vertical guide channels extending through the bottom ring from the lower surface to the upper surface, wherein each of the plurality of vertical guide channels includes a first region having a smaller diameter than a diameter of the plurality of vertical guide channels, and wherein the plurality of vertical guide channels are configured to receive respective lift pins for raising and lowering the moveable edge ring; and a raised annular rim extending upwardly along the upper surface and having an inner annular diameter located radially inwardly from the lower annular inner diameter and an outer annular diameter located radially inwardly from the lower annular outer diameter, and wherein the plurality of vertical guide channels extend through the raised annular rim between the inner annular diameter and outer annular diameter of the raised annular rim.

2. The bottom ring of claim 1, wherein the diameter of the plurality of vertical guide channels is between 0.063" and 0.067".

3. The bottom ring of claim 1, further comprising a plurality of cavities surrounding the plurality of vertical guide channels, respectively, on the lower surface of the bottom ring, wherein the plurality of cavities have a diameter greater than the plurality of vertical guide channels.

4. The bottom ring of claim 3, wherein transitions between the plurality of vertical guide channels and the plurality of cavities are chamfered.

5. The bottom ring of claim 4, wherein the chamfered transitions have a height and width between 0.020" and 0.035" and an angle between 40° and 50°.

6. The bottom ring of claim 1, wherein the raised annular rim is configured to extend into a groove in a lower surface of the moveable edge ring.

7. The bottom ring of claim 1, wherein the first region of the plurality of vertical guide channels is arranged in the raised annular rim.

8. The bottom ring of claim 1, wherein the upper surface includes an inner annular rim extending radially inwardly and upwardly relative to the lower annular inner diameter, and wherein the raised annular rim and the inner annular rim define a groove.

9. The bottom ring of claim 8, wherein a height of the raised annular rim is less than a height of the inner annular rim.

10. The bottom ring of claim 8, wherein the inner annular rim is configured to support an edge of a substrate.

11. The bottom ring of claim 1, wherein at least one of a first upper corner and a second upper corner of the raised annular rim is chamfered.

12. The bottom ring of claim 1, wherein the upper surface includes at least five changes of direction.

13. The bottom ring of claim 1, wherein the upper surface includes at least five alternating vertical and horizontal paths.

14. The bottom ring of claim 1, wherein the lower surface includes a plurality of cavities configured to be aligned with bolt holes in a baseplate of the substrate support.

15. The bottom ring of claim 1, wherein the outer annular diameter of the raised annular rim is located radially outwardly from the lower annular inner diameter.

16. The bottom ring of claim 1, wherein the diameter of the plurality of vertical guide channels extending above and below the first region through the annular body is constant above and below the first region.

17. The bottom ring of claim 1, wherein the raised annular rim being offset relative to the lower inner annular diameter and the lower outer annular diameter of the annular body.

18. The bottom ring of claim 1, wherein the outer annular diameter of the raised annular rim and the lower outer annular diameter form a step to support a radially outer portion of the moveable edge ring.

\* \* \* \* \*